(12) United States Patent
Sasaki et al.

(10) Patent No.: US 6,603,202 B2
(45) Date of Patent: Aug. 5, 2003

(54) CIRCUIT BOARD-PROVIDING ARTICLE, CIRCUIT BOARD, SEMICONDUCTOR DEVICE AND PROCESS FOR THE PRODUCTION OF THE SAME

(75) Inventors: Masayuki Sasaki, Nagano (JP); Hideaki Sakaguchi, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 09/747,397

(22) Filed: Dec. 22, 2000

(65) Prior Publication Data

US 2001/0006119 A1 Jul. 5, 2001

(30) Foreign Application Priority Data

Dec. 27, 1999 (JP) ............................................. 11-368652

(51) Int. Cl.[7] ......................... H01L 23/12; H01L 23/053
(52) U.S. Cl. ......................... 257/701; 257/295; 257/778
(58) Field of Search ............................ 438/3, 106, 108, 438/125, 126, 127, 387, 396; 257/295, 306, 296, 750, 778, 701

(56) References Cited

U.S. PATENT DOCUMENTS 5,049,979 A * 9/1991 Hashemi et al. ............... 357/75
6,294,407 B1 * 9/2001 Jacobs ........................ 438/118
6,351,005 B1 * 2/2002 Al-Shareef et al. ......... 257/306

FOREIGN PATENT DOCUMENTS

JP          A-10-93246          4/1998

* cited by examiner

Primary Examiner—Amir Zarabian
Assistant Examiner—Pamela Perkins
(74) Attorney, Agent, or Firm—Paul & Paul

(57) ABSTRACT

A circuit board for use in the production of semiconductor devices, in which the circuit board includes two or more by-pass capacitors formed thereon, and each by-pass capacitor is constituted from a first electrode layer formed in the uppermost layer of the circuit board, a ferroelectric layer formed, from a ferroelectric material having a higher dielectric constant than the upper electrode layer, over the first electrode layer, and a second electrode layer formed over the ferroelectric layer, and a semiconductor device comprising the circuit board having mounted thereon a semiconductor element. A circuit board-providing article for use in the production of the circuit board, and a process for the production of the circuit board and the semiconductor device, are also disclosed.

11 Claims, 21 Drawing Sheets

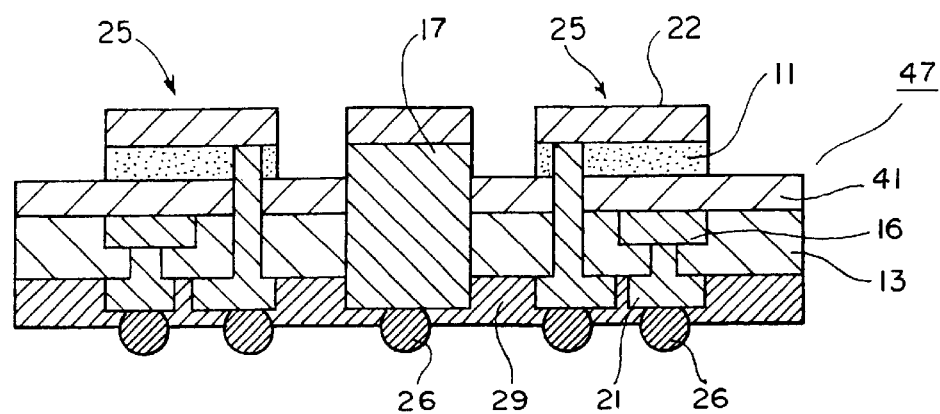
F I G . 5
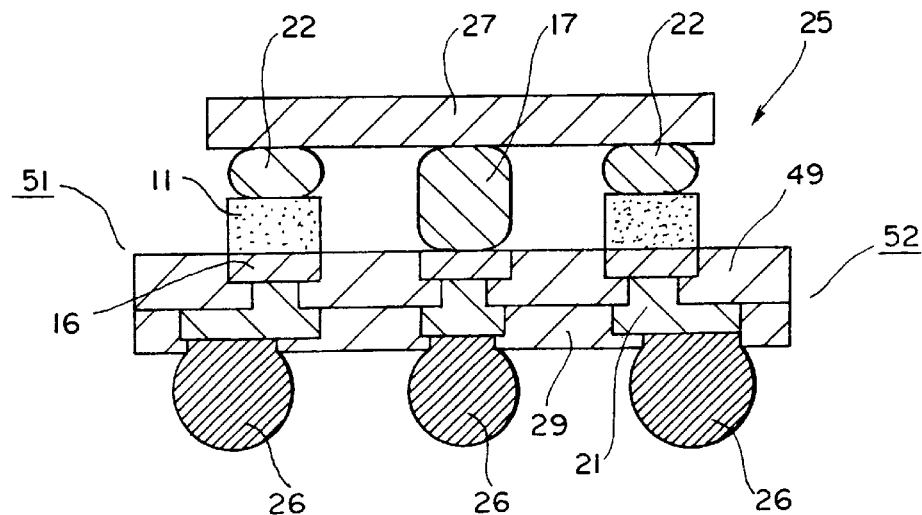
F I G . 6

CIRCUIT BOARD-PROVIDING ARTICLE, CIRCUIT BOARD, SEMICONDUCTOR DEVICE AND PROCESS FOR THE PRODUCTION OF THE SAME

BACKGROUND OF THE INVENTION

1. Field of the Invention

The present invention relates to a circuit board and a semiconductor device using such a circuit board as well as a production process of the same. The present invention also relates to a circuit board-providing article useful in the production of the circuit board of the present invention.

2. Description of the Related Art

In recent years, there has been a tendency that semiconductor chips are mounted with a high density, and a high integration degree, on a circuit board to form a semiconductor device. Typical examples of such semiconductor devices, which are practically used, include a PGA, i.e., Pin Grid Array, and a BGA, i.e., Ball Grid Array.

Further, in the circuit board having mounted thereon semiconductor chips, to reduce a noise generated during operation of the semiconductor device, it is conventionally carried out to provide one or more chip capacitors as an outer constitutional part on a surface of the circuit board. However, since the chip capacitor(s) have to be mounted on a surface of the circuit board, the semiconductor device suffers from the problem that the noise cannot be satisfactory absorbed because of the distance between the semiconductor chips and the capacitor(s). In addition, there is also a problem that the circuit board is large and thus a semiconductor device has to be produced as a result of the outer mounting of the capacitor(s).

Recently, to avoid the above problems, it has been suggested to incorporate capacitor(s) in the interior of the circuit board. For example, Japanese Unexamined Patent Publication (Kokai) No. 10-93246 teaches a multilayered wiring board comprising a capacitor sandwiched between the wiring layers of the board to reduce the number of the elements or parts to be packaged in the board to thereby enable high density formation of the wiring along with reduction in size of the finally produced semiconductor devices. More particularly, the multilayered wiring board of JPP' 246, as illustrated in FIG. 1, has a multilayered wiring section 102, and the multilayered wiring section 102 has alternately disposed thin film wiring conductors 104a and 104b and others (not shown) which are electrically connected with each other through a through-hole conductor 109 (partly shown) formed in insulating layers 103a, 103b and 103c made of an organic resin. At least one layer of the organic insulating layers, i.e., layer 103b contains dielectric fillers having a dielectric constant of not less than 20 to form a high dielectric organic insulating layer. Thus, a capacitor is formed by the layer 103b and its lower wiring conductor 104a and upper wiring conductor 104b. Further, the upper wiring conductor 104b is laminated through a nickel layer 110 to an upper surface of the layer 103b to provide good bonding between these layers. Furthermore, the lower wiring conductor 104a has a surface roughness of 0.05 $\mu m \leq$ (Ra) $\leq 5$ $\mu m$ to also provide good bonding between this layer and the layer 103b. According to this multilayered wiring board, since a specific capacitor part is not required to be packaged in the board, it becomes possible to reduce the number of the parts to be included in the board.

However, the prior art circuit boards including the multiwired wiring board of Japanese Kokai 10-93246 cannot fully solve the above problems. That is, it is still desired to provide a noise-free and small sized circuit board provided with capacitor(s) for use in the production of semiconductor devices.

SUMMARY OF THE INVENTION

It is therefore an object of the present invention to provide a circuit board capable of reducing its size, along with having a high absorption efficiency of noise.

It is another object of the present invention to provide a process for the production of the improved circuit board of the present invention.

It is still another object of the present invention to provide a semiconductor device using the improved circuit board of the present invention.

Further, it is still another object of the present invention to provide a process for the production of the semiconductor device of the present invention.

Furthermore, it is still another object of the present invention to provide a circuit board-providing article suitable in the production of the improved circuit board of the present invention.

These and other objects of the present invention will be easily understood from the following detailed description of the preferred embodiments of the present invention.

The inventors of the present invention have conducted intensive studies to accomplish the objects described above, and have discovered an improved circuit board and semiconductor device using the same.

According to one aspect of the present invention, there is provided a circuit board-providing article for use in the production of a circuit board having provided thereon by-pass capacitor(s), said article comprising a metallic foil having laminated to one surface thereof a layer of the ferroelectric material.

According to another aspect of the present invention, there is provided a circuit board for use in the production of semiconductor devices, in which said circuit board comprises two or more by-pass capacitors formed thereon, and each said by-pass capacitor is constituted from a first electrode layer formed in the uppermost layer of the circuit board, a ferroelectric layer formed, from a ferroelectric material having a higher dielectric constant than said upper electrode layer, over the first electrode layer, and a second electrode layer formed over the ferroelectric layer, and is designed to be electrically contacted with a power source or grounding terminal of a semiconductor element.

According to still another aspect of the present invention, there is provided a process for the production of a circuit board in which said circuit board comprises two or more by-pass capacitors formed thereon, and each said by-pass capacitor is constituted from a first electrode layer formed in the uppermost layer of the circuit board, a ferroelectric layer formed, from a ferroelectric material having a higher dielectric constant than said upper electrode layer, over the first electrode layer, and a second electrode layer formed over the ferroelectric layer, in which said by-pass capacitor is produced by the steps of:

providing an article comprising a metallic foil having laminated to one surface thereof a layer of the ferroelectric material;

plating a surface of the ferroelectric material layer of said article with an electrically conductive metal to form a first conductor layer covering the surface of the ferroelectric material layer;

selectively etching the first conductor layer to form said first electrode layer;

selectively etching the metal foil of said article to form said second electrode layer opposed through said ferroelectric material layer to said first electrode layer; and removing the exposed area of said ferroelectric material layer to form said by-pass capacitors having a sandwich structure of said first electrode layer, said ferroelectric layer and said second electrode layer, on the resulting circuit board.

Further, according to still another aspect of the present invention, there is provided a semiconductor device comprising a circuit board having mounted thereon a semiconductor element, in which said circuit board comprises two or more by-pass capacitors formed thereon, each said by-pass capacitor is constituted from a first electrode layer formed in the uppermost layer of the circuit board, a ferroelectric layer formed, from a ferroelectric material having a higher dielectric constant than said upper electrode layer, over the first electrode layer, and a second electrode layer formed over the ferroelectric layer, and the second electrode layer of said by-pass capacitor is electrically contacted with a power source or grounding terminal of said semiconductor element.

Furthermore, according to still another aspect of the present invention, there is provided a process for the production of a semiconductor device comprising a circuit board having mounted thereon a semiconductor element, in which said circuit board comprises two or more by-pass capacitors formed thereon, each said by-pass capacitor is constituted from a first electrode layer formed in the uppermost layer of the circuit board, a ferroelectric layer formed, from a ferroelectric material having a higher dielectric constant than said upper electrode layer, over the first electrode layer, and a second electrode layer formed over the ferroelectric layer, in which said process comprises the steps of:

providing an article comprising a metallic foil having laminated to one surface thereof a layer of the ferroelectric material;

plating a surface of the ferroelectric material layer of said article with an electrically conductive metal to form a first conductor layer covering the surface of the ferroelectric material layer;

selectively etching the first conductor layer to form said first electrode layer;

selectively etching the metal foil of said article to form said second electrode layer opposed through said ferroelectric material layer to said first electrode layer;

removing the exposed area of said ferroelectric material layer to form said by-pass capacitors having a sandwich structure of said first electrode layer, said ferroelectric layer and said second electrode layer, on the resulting circuit board; and electrically connecting said second electrode layer of said by-pass capacitor through flip chip connection a power source or grounding terminal of said semiconductor element.

According to the present invention, there can be provided the circuit board capable of effectively absorbing a noise generated due to the constitution of the board and reducing a size of the board, the semiconductor device capable of effectively exhibit the excellent performances of the circuit board of the present invention, and the effective production method for the circuit board and the semiconductor device, in addition to the article useful as a starting material in the production of the circuit board.

BRIEF DESCRIPTION OF THE DRAWINGS

FIG. 5 is a cross-sectional view of the circuit board according to another preferred embodiment of the present invention;

FIG. 6 is a cross-sectional view of the semiconductor device according to still another preferred embodiment of the present invention;

DESCRIPTION OF THE PREFERRED EMBODIMENTS

Figure 1:
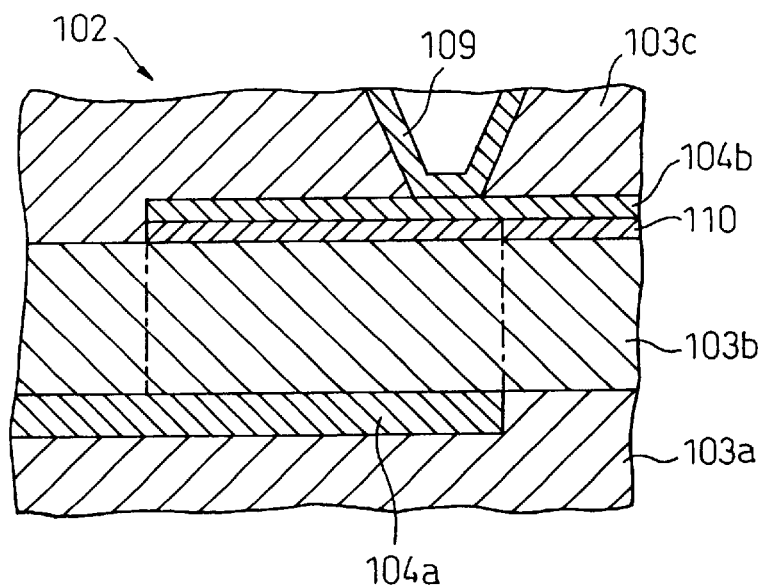
FIG. 1 is an enlarged cross-sectional view of a part of the prior art multilayered wiring board.

The present invention is described with reference to the preferred embodiments thereof.

The present invention resides in a circuit board-providing article for use in the production of a circuit board having provided thereon by-pass capacitors, decoupling capacitors or other capacitors. The circuit board-providing article of the present invention comprises a metallic foil having laminated to one surface thereof a layer of the ferroelectric material.

In the circuit board-providing article of the present invention, the metallic foil is preferably a foil, layer, film or coating of the electrically conductive material, because the metallic foil is preferably used in the formation of the electrode layer of the capacitor mounted on the circuit board. Typical examples of the material suitable as the metallic foil, although not restricted to, include copper, nickel and their alloy. A thickness of the metallic layer may be widely varied depending upon the particulars of the circuit board to be produced and the production process of the circuit board.

Further, a layer of the ferroelectric material may be formed from any ferroelectric materials, however, in the practice of the present invention, it is preferred that the ferroelectric material used in the formation of this layer has a higher dielectric constant than an upper electrode layer used in the formation of the capacitor which will be described hereinafter. Typical examples of the ferroelectric material suitable in the formation of the ferroelectric material layer, although not restricted thereto, include strontium titanate ($SrTiO_2$), PZT (lead zirconate titanate), tantalum oxide ($Ta_2O_5$) and barium titanate ($BaTiO_2$). A thickness of the ferroelectric material layer may be widely varied depending upon the particulars of the circuit board to be produced and the production process of the circuit board.

Furthermore, it is preferred that the circuit board-providing article further comprises a layer of the soldering material, i.e., a solder layer. The solder layer may be disposed on the same side with or on the opposite side to the ferroelectric material layer. Preferably, the solder layer is used in the formation of a soldering means for receiving and connecting the semiconductor element such as IC chips and LSI chips.

Using the circuit board-providing article of the present invention, it becomes possible to effectively and easily produce the circuit boards and thus the semiconductor devices with a high reliability.

The present invention also resides in a circuit board particularly suitable in the production of semiconductor devices. The circuit board of the present invention is characterized in that the circuit board comprises two or more by-pass capacitors formed thereon, and each of the by-pass capacitors is constituted from the following constitutional elements:

a first electrode layer formed in the uppermost layer of the circuit board, a ferroelectric layer formed, from a ferroelectric material having a higher dielectric constant than the upper electrode layer, over the first electrode layer, and a second electrode layer formed over the ferroelectric layer. The second electrode layer of the by-pass capacitor is electrically contacted with a power source or grounding terminal of a semiconductor element.

In the circuit board of the present invention, it is preferred that the by-pass capacitors each is disposed in a mounting area of the semiconductor element, along with a pad to which a signal terminal of the semiconductor element is connected.

It is also preferred that the by-pass capacitor is disposed so that it is positioned substantially below the semiconductor element. Flip chip connection is preferably used to form an electrical connection between the by-pass capacitor of the circuit board and the semiconductor device. The direct application of the by-pass capacitor below the semiconductor element is particularly effective to absorb the noise generated due to the power source.

Further, it is preferred in connection with the flip chip connection that the circuit board further comprises a solder layer for receiving and connecting the semiconductor element. The solder layer is preferably deposited on a surface of the second electrode layer or a pad of the board.

As mentioned above, in the circuit board of the present invention, it is preferred that the ferroelectric layer is formed from strontium titanate, PZT, tantalum oxide or barium titanate.

In the circuit board of the present invention, the layers of the by-pass capacitor, i.e., the first electrode layer, ferroelectric layer and second electric layer, and other layers are generally used as a single layer, however, if necessary, each layer may be constituted as a combination of two or more layers. In the combination of the layers, the layers may be the same or different.

In addition to the circuit board, the present invention resides in a process for the production of a circuit board in which the circuit board comprises two or more by-pass capacitors formed thereon, and each by-pass capacitor is constituted from a first electrode layer formed in the uppermost layer of the circuit board, a ferroelectric layer formed, from a ferroelectric material having a higher dielectric constant than the upper electrode layer, over the first electrode layer, and a second electrode layer formed over the ferroelectric layer. The production process of the present invention is characterized in that the by-pass capacitor is produced by the steps of:

providing an article comprising a metallic foil having laminated to one surface thereof a layer of the ferroelectric material;

plating a surface of the ferroelectric material layer of the article with an electrically conductive metal to form a first conductor layer covering the surface of the ferroelectric material layer;

selectively etching the first conductor layer to form the first electrode layer;

selectively etching the metal foil of the article to form the second electrode layer opposed through the ferroelectric material layer to the first electrode layer; and removing the exposed area of the ferroelectric material layer to form the by-pass capacitors having a sandwich structure of the first electrode layer, the ferroelectric layer and the second electrode layer, on the resulting circuit board.

The production process of the circuit board according to the present invention can be advantageously carried out by different methods, typical examples of which will be described below. Note, however, that the production process of the present invention should not be limited to the below mentioned.

In one preferred aspect of the present invention, the production process of the circuit board can be carried out by the steps of:

providing an article comprising a metallic foil having laminated to one surface thereof a layer of the ferroelectric material;

forming a pad-providing opening in the ferroelectric material layer of the article to expose a surface of the underlying metallic foil from the opening;

plating a surface of the article with an electrically conductive metal to form a first conductor layer filling the opening of and covering a surface of the ferroelectric material layer;

selectively etching the first conductor layer to form the first electrode layer and a pad;

deposing an electrically insulating material over the ferroelectric material layer to form a first insulating layer;

selectively etching the first insulating layer to form a wiring-providing opening therein;

plating a surface of the etched first insulating layer with an electrically conductive metal to form a second conductor layer;

selectively etching the second conductor layer to form a wiring pattern connecting the first electrode layer and the pad;

selectively etching the metallic foil of the article to form the second electrode layer opposed through the ferroelectric material layer to the first electrode layer; and removing the exposed area of the ferroelectric material layer to form by-pass capacitors, each having a sandwich structure of the first electrode layer, the ferroelectric layer and the second electrode layer, on the resulting circuit board.

In this production process, it is preferred that the process further comprises the step of applying to a surface of the second electrode layer a soldering means for receiving and connecting a semiconductor element.

In another aspect of the present invention, the production process of the circuit board can be preferably carried out by using the article having a solder layer laminated on another surface of the metallic foil. The solder layer is selectively etched off to form a soldering means for receiving and connecting a semiconductor device.

More preferably, the above production process can be carried out by the steps of:

providing an article comprising a metallic foil having laminated to one surface thereof a layer of the ferroelectric material and to another surface thereof a solder layer;

forming a pad-providing opening in the ferroelectric material layer of the article to expose a surface of the underlying metallic foil from the opening;

plating a surface of the article with an electrically conductive metal to form a first conductor layer filling the opening of and covering a surface of the ferroelectric material layer;

selectively etching the first conductor layer to form the first electrode layer and a pad;

deposing an electrically insulating material over the ferroelectric material layer to form a first insulating layer;

selectively etching the first insulating layer to form a wiring-providing opening therein;

plating a surface of the etched first insulating layer with an electrically conductive metal to form a second conductor layer;

selectively etching the second conductor layer to form a wiring pattern connecting the first electrode layer and the pad;

selectively etching the solder layer of the article to form a soldering means for receiving a semiconductor element, the soldering means being opposed through the metallic foil and the ferroelectric material layer to the first electrode layer;

selectively etching the exposed area of the metallic foil to form the second electrode layer opposed through the ferroelectric material layer to the first electrode layer; and selectively etching the exposed area of the ferroelectric material layer to form by-pass capacitors, each having a sandwich structure of the first electrode layer, the ferroelectric layer and the second electrode layer, on the resulting circuit board, along with the soldering means formed on the second electrode layer.

In another aspect of the present invention, the production process of the circuit board can be preferably carried out by applying a solder layer on a surface of the article on the same side with the ferroelectric material layer. The solder layer is selectively etched off to form a soldering means for receiving and connecting a semiconductor device.

More preferably, the production process of the circuit board can be carried out by the steps of:

providing an article comprising a metallic foil having laminated to one surface thereof a layer of the ferroelectric material;

forming a pad-providing opening in the ferroelectric material layer of the article to expose a surface of the underlying metallic foil from the opening;

plating a surface of the article with an electrically conductive metal to form a first conductor layer filling the opening of and covering a surface of the ferroelectric material layer;

forming a solder layer over the first conductor layer;

selectively etching the metallic foil to form the first electrode layer and a pad;

deposing an electrically insulating material over the ferroelectric material layer to form a first insulating layer;

selectively etching the first insulating layer to form a wiring-providing opening therein;

plating a surface of the etched first insulating layer with an electrically conductive metal to form a second conductor layer;

selectively etching the second conductor layer to form a wiring pattern connecting the first electrode layer and the pad;

selectively etching the solder layer to form a soldering means for receiving and connecting a semiconductor element, the soldering means being opposed through the first conductor layer and the ferroelectric material layer to the first electrode layer;

selectively etching the exposed area of the first conductor layer to form the second electrode layer opposed through the ferroelectric material layer to the first electrode layer; and selectively etching the exposed area of the ferroelectric material layer to form by-pass capacitors, each having a sandwich structure of the first electrode layer, the ferroelectric layer and the second electrode layer, on the resulting circuit board, along with the soldering means formed on the second electrode layer.

In still another aspect of the present invention, the production process of the circuit board can be preferably carried out by the steps of:

providing an article comprising a metallic foil having laminated to one surface thereof a layer of the ferroelectric material;

forming a pad-providing opening in the ferroelectric material layer of the article to expose a surface of the underlying metallic foil from the opening;

plating a surface of the article with an electrically conductive metal to form a third conductor layer filling the opening of and covering a surface of the ferroelectric material layer;

selectively etching the third conductor layer to form the first electrode layer and a pad;

deposing an electrically insulating material over the ferroelectric material layer to form a second insulating layer;

forming a hole in the neighborhood of the first electrode layer in the second insulating layer and the ferroelectric material layer so that a surface of the metallic foil is exposed through the hole;

plating a surface of the article with an electrically conductive metal to form a fourth conductor layer filling the hole of and covering a surface of the second insulating layer, while connecting the first electrode layer and the pad;

selectively etching the fourth conductor layer to form a wiring pattern connecting the first electrode layer, the pad and the metallic foil;

selectively etching the metallic foil of the article to form the second electrode layer opposed through the ferroelectric material layer to the first electrode layer; and removing the exposed area of the ferroelectric material layer to form by-pass capacitors, each having a sandwich structure of the first electrode layer, the ferroelectric layer and the second electrode layer, on the resulting circuit board.

In this production process, it is preferred that the above production steps further include the step of applying to a surface of the second electrode layer a soldering means for receiving and connecting a semiconductor element.

In still another aspect of the present invention, the production process of the circuit board can be preferably carried out by the steps of:

providing an article comprising a first metallic foil having laminated to one surface thereof a layer of the ferroelectric material;

forming an interlayer insulating layer and a second metallic foil, in the described order, on the ferroelectric material layer of the article;

selectively etching the second metallic foil to form the first electrode layer;

deposing an electrically insulating material over the interlayer insulating layer having formed thereon the first electrode layer to form a third insulating layer;

forming, in the third insulating layer, the interlayer insulating and the ferroelectric material layer, a hole in the neighborhood of the first electrode layer and a pad-providing opening so that a surface of the first metallic foil is exposed through the hole and the opening;

plating a surface of the article with an electrically conductive metal to form a fifth conductor layer filling the hole and the opening and covering a surface of the third insulating layer, while connecting the first electrode layer;

selectively etching the fifth conductor layer to form a wiring pattern and pad connecting the first electrode layer and the first metallic foil;

selectively etching the first metallic foil to form the second electrode layer opposed through the ferroelectric material layer to the first electrode layer; and removing the exposed area of the ferroelectric material layer to form by-pass capacitors, each having a sandwich structure of the first electrode layer, the ferroelectric layer and the second electrode layer, on the resulting circuit board.

In this production process, it is preferred that the above production steps further include the step of applying to a surface of the second electrode layer a soldering means for receiving and connecting a semiconductor element.

In still another aspect of the present invention, the production process of the circuit board can be preferably carried out by the steps of:

providing an article comprising a metallic foil having laminated to one surface thereof a layer of the ferroelectric material;

forming a pad-providing opening in the ferroelectric material layer of the article to expose a surface of the underlying metallic foil from the opening;

forming a solder layer filling the pad-providing opening and covering a surface of the ferroelectric material layer;

selectively etching said metallic foil to form said first electrode layer and said pad;

deposing an electrically insulating material over the ferroelectric material layer to form a fourth insulating layer;

selectively etching the fourth insulating layer to form a wiring-providing opening therein;

plating a surface of the etched fourth insulating layer with an electrically conductive metal to form a sixth conductor layer;

selectively etching the sixth conductor layer to form a wiring pattern connecting the first electrode layer and the pad;

selectively etching the solder layer to form a soldering means capable of acting as said second electrode layer and for receiving and connecting a semiconductor element, the soldering means being opposed through the ferroelectric material layer to the first electrode layer; and selectively etching the exposed area of the ferroelectric material layer to form by-pass capacitors, each having a sandwich structure of the first electrode layer, the ferroelectric layer and the second electrode layer, on the resulting circuit board.

In still another aspect of the present invention, the production process of the circuit board can be preferably carried out by the steps of:

providing an article comprising a metallic foil having laminated to one surface thereof a layer of the ferroelectric material;

forming a pad-providing opening in the ferroelectric material layer of the article to expose a surface of the underlying metallic foil from the opening;

filling the pad-providing opening with copper;

forming a solder layer covering a surface of the filled copper and the ferroelectric material layer;

selectively etching the metallic foil to form the first electrode layer and the pad;

deposing an electrically insulating material over the exposed ferroelectric material layer to form a fourth insulating layer;

selectively etching the fourth insulating layer to form a wiring-providing opening therein;

plating a surface of the etched fourth insulating layer with an electrically conductive metal to form a sixth conductor layer;

selectively etching the sixth conductor layer to form a wiring pattern connecting the first electrode layer and the pad;

selectively etching the solder layer to form a soldering means capable of acting as said second electrode layer and for receiving and connecting a semiconductor element, the soldering means being opposed, through the ferroelectric material layer, to the first electrode layer; and selectively etching the exposed area of the ferroelectric material layer to form by-pass capacitors, each having a sandwich structure of the first electrode layer, the ferroelectric layer and the second electrode layer, on the resulting circuit board.

In addition to the circuit board-providing article and the circuit board and its production process, the present invention resides in a semiconductor device and a production process thereof.

The semiconductor device of the present invention comprises a circuit board having mounted thereon a semiconductor element, and is characterized in that the circuit board comprises two or more by-pass capacitors formed thereon, and each by-pass capacitor is constituted from a first electrode layer formed in the uppermost layer of the circuit board, a ferroelectric layer formed, from a ferroelectric material having a higher dielectric constant than the upper electrode layer, over the first electrode layer, and a second electrode layer formed over the ferroelectric layer, and the second electrode layer of the by-pass capacitor is electrically contacted with a power source or grounding terminal of the semiconductor element.

Preferably, as briefly mentioned above, each by-pass capacitors is disposed in a mounting area of and is connected through flip chip connection with the semiconductor element. More preferably, the by-pass capacitor is disposed substantially below the semiconductor element.

The production process of the semiconductor device according to the present invention is characterized by comprising the steps of:

providing an article comprising a metallic foil having laminated to one surface thereof a layer of the ferroelectric material;

plating a surface of the ferroelectric material layer of the article with an electrically conductive metal to form a first conductor layer covering the surface of the ferroelectric material layer;

selectively etching the first conductor layer to form the first electrode layer;

selectively etching the metal foil of the article to form the second electrode layer opposed through the ferroelectric material layer to the first electrode layer;

removing the exposed area of the ferroelectric material layer to form the by-pass capacitors having a sandwich structure of the first electrode layer, the ferroelectric layer and the second electrode layer, on the resulting circuit board; and electrically connecting the second electrode layer of the by-pass capacitor through flip chip connection with the semiconductor element, preferably its power source or grounding terminal.

In this production process, it is preferred that a soldering layer for receiving and connecting the semiconductor element is formed on the second electrode layer.

Next, referring to the accompanying drawings, the present invention will be further described with regard to typical examples of the circuit board-providing article, circuit board and semiconductor device according to the preferred embodiments of the present invention, along with their production processes. Note, however, that the present invention should not be restricted to these examples, and the described circuit boards and semiconductor devices as well as their production processes may be freely modified or improved within the scope of the present invention.

Figure 2:
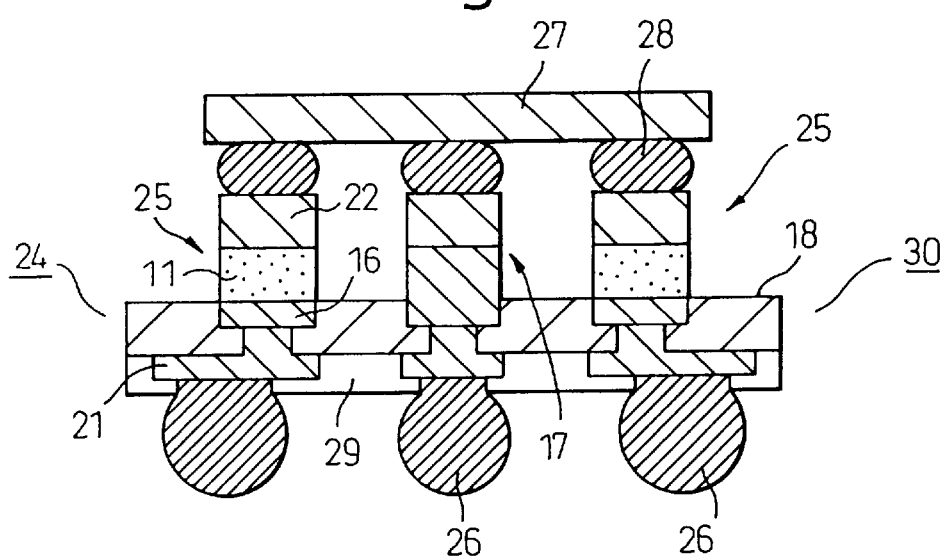
FIG. 2 is a cross-sectional view of the semiconductor device according to one preferred embodiment of the present invention.

FIG. 2 is a cross-sectional view of the semiconductor device according to one preferred embodiment of the present invention suitable in the production of semiconductor devices.

The semiconductor device 30 comprises a circuit board 24 and a semiconductor chip 27 mounted on the circuit board 24. The circuit board 24 is made according to the present invention, and, as shown, has two by-pass capacitors 25 formed on the insulating layer 18 thereof. The circuit board 24 also has a wiring pattern 21 formed in an opposite side to the by-pass capacitor 25. The wiring pattern 21 has a single layer structure, however, if desired, it may be formed as a multilayered structure. A lower surface of the wiring pattern 21 has a solder ball 26 acting as an external connection terminal. The reference numeral 29 indicates a solder resist layer.

As is shown, the by-pass capacitors 25 are positioned just below the semiconductor chip 27, and they are connected by a flip chip connection method. Namely, these two parts are electrically connected through a solder 28.

Each by-pass capacitor 25 is constituted from a first electrode layer 16 formed in the uppermost layer, i.e., the insulating layer 18, of the circuit board 24, a ferroelectric layer 11 formed over the first electrode layer 16 and a second electrode layer 22 formed over the ferroelectric layer 11.

In addition to the by-pass capacitors 25, the circuit board 24 has a pad 17 also disposed in a mounting area of the semiconductor chip 27. The pad 17 is used for receiving and connecting a signal terminal of the semiconductor chip 27.

FIGS. 8A to 8K are cross-sectional views showing, in sequence, the preferred production process of the semiconductor device of FIG. 2.

Figure 8A:
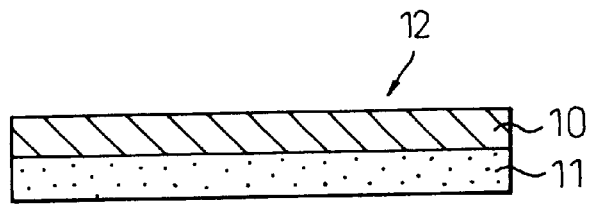
FIGS. 8A to 8K are cross-sectional views showing, in sequence, the production of the semiconductor device of FIG. 2.

First, as is shown in FIG. 8A, a circuit board-providing article 12 is prepared. The article 12 is made of a copper foil 10 and one surface of the copper foil 10 has applied thereon a layer 11 of the ferroelectric material. The ferroelectric layer 11 is made of any conventional ferroelectric materials. Suitable ferroelectric materials include, for example, STO (strontium titanate, $SrTiO_3$), PZT (lead zirconate titanate, $PbZr_xTi_{1-x}O_3$), tantalum oxide ($Ta_2O_5$) and barium titanate ($BaTiO_3$). These ferroelectric materials are deposited at a desired thickness on a surface of the copper foil 10 using a conventional film forming method such as sputtering and chemical vapor deposition (CVD). Note, in the circuit board-providing article 12, any one of other metallic foils may be used in place of the copper foil 10, if desired.

Figure 8B:
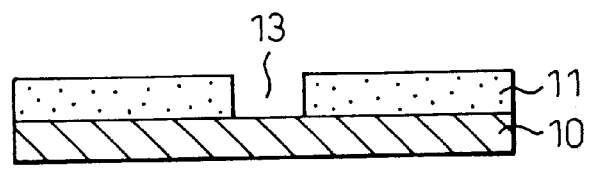

After preparation of the circuit board-providing article 12, as is shown in FIG. 8B, a pad-providing opening 13 is formed in the ferroelectric layer 11 to expose the underlying copper foil 10 from the opening 13. Laser fabrication method is preferably used in the formation of the opening 13, however, any other boring methods may be used, if they are appropriate.

Figure 8C:
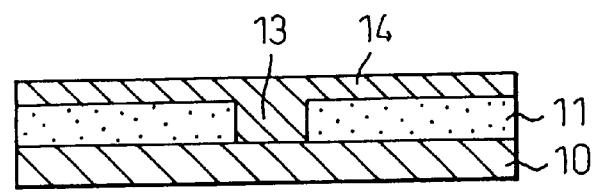

Then, as is shown in FIG. 8C, copper plating is applied over the circuit board-providing article 12 to form a first copper plating layer (hereinafter, also referred to as "conductor layer") 14. The pad-providing opening 13 is filled with and the ferroelectric layer 11 is covered with the first copper plating layer 14. Copper plating is preferably carried out by using an electroless copper plating or an electrolytic copper plating. In the formation of this first conductor layer 14, if desired, any other conducting materials may be used in place of the copper, along with any deposition technologies including plating.

Figure 8D:
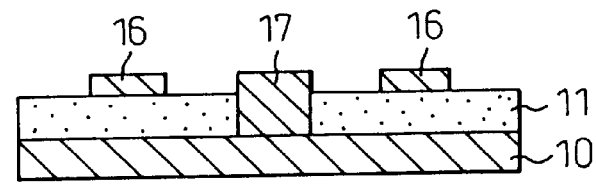

Following the formation of the first copper plating layer 14, as is shown in FIG. 8D, it is selectively etched to form a first electrode layer 16 for use as one constitutional element of the target by-pass capacitor, along with a pad 17. Note in this figure that only two first electrode layers 16 and one pad 17 are illustrated to simplify the explanation of the formation of the by-pass capacitor, however, generally, many first electrode layers and pads are incorporated in the by-pass capacitor.

Figure 8E:
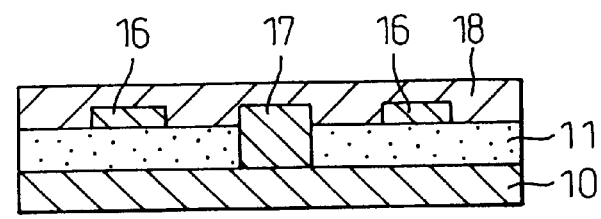

Next, as is shown in FIG. 8E, a first insulating layer 18 is applied over a surface of the ferroelectric layer 11 partially exposed as a result of the above selective etching. The first insulating layer 18 is preferably formed by coating a solution of a non-photosensitive resin such as polyimide or polyphenyleneether to or adhering a sheet of such resin to a surface of the ferroelectric layer 11. Of course, any other film formation methods may be used, if desired.

Figure 8F:
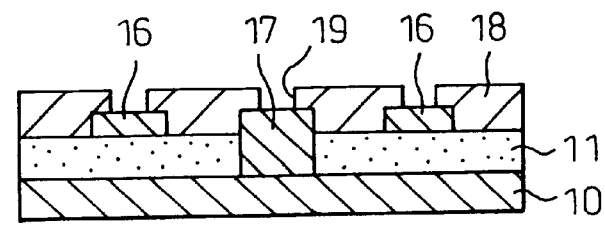

Next, as is shown in FIG. 8F, the first insulating layer 18 is selectively removed to form via hole 19. The formation of the via hole 19 is preferably carried out by using a laser fabrication method. As a result, the first electrode layer 16 and the pad 17, both formed in the previous step, are exposed in the bottom section of the via hole 19. Note that a photolithographic process may be used in the formation of the via hole 19, if desired. That is, a photosensitive and electrically insulating resist material may be used in the formation of the first insulating layer 18, because it can be photolithographically etched off to form a via hole 19.

Figure 8G:
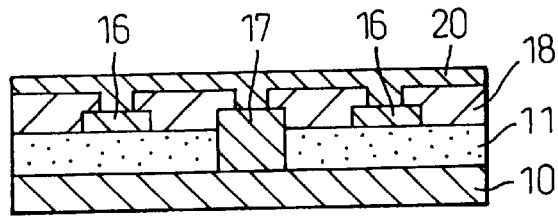

Thereafter, as is shown in FIG. 8G, a second copper plating layer (second conductor layer) 20 is formed over the first insulating layer 18. An electroless copper plating or an electrolytic copper plating is preferably used for this purpose. The resulting second copper plating layer 20 is electrically connecting with the first electrode layer 16 and the pad 17.

Figure 8H:
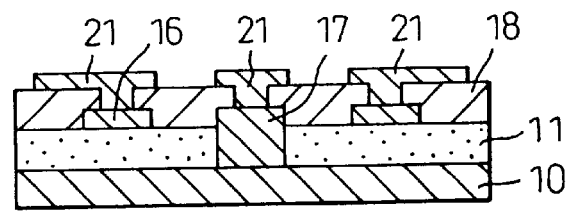

The second copper plating layer 20 is then selectively etched to form a wiring pattern 21, as is shown in FIG. 8H. The wiring pattern 21 is electrically connecting with the first electrode layer 16 and the pad 17.

In the formation of the wiring pattern 21, if necessary, the above-described steps of the formation of the insulating layer, via hole, copper plating layer and wiring pattern may be repeated to form a multilayed circuit board (not shown).

Figure 8I:
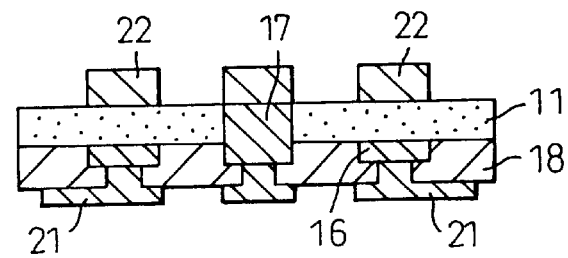

Following the formation of the wiring pattern 21, as is shown in FIG. 8I, a copper foil 10 is selectively etched to form a second electrode layer 22. For example, the copper foil 10 can be etched with a suitable etchant, i.e., etching solution, in the presence of the masking means covering other areas than the area for forming a second electrode layer 22. Any conventional etching method may be used for this purpose. The resulting second electrode layer 22 is opposed through the ferroelectric layer 11 to the first electrode layer 16 previously formed.

Figure 8J:
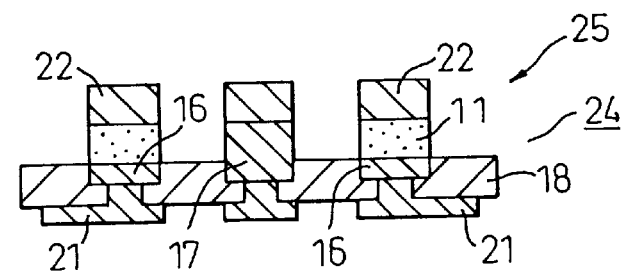

Thereafter, as is shown in FIG. 8J, the ferroelectric layer 11, a part of which was exposed as a result of the selective etching of the copper foil 10, is further etched to transfer a pattern of the second electrode layer 22 to the underlying ferroelectric layer 22, thereby forming a circuit board 24 having a by-pass capacitor 25 thereon. As in the formation of the second electrode layer 22, an etchant is preferably used in this etching process.

In the formation of the second electrode layer 22 and the patterned ferroelectric layer 11, it is preferred that different etchants are used in each of the etching processes so that the resulting pattern may be utilized as a masking means in the etching of the underlying layer. For example, in the etching of the ferroelectric layer 11, the previously formed second electrode layer 22 can be effectively used as a masking means, if the etchant used therein can selectively dissolve and thus etch off only the ferroelectric layer 11.

In the resulting circuit board 24, two or more first electrode layers 16 are formed on the uppermost insulating layer (first insulating layer) 18 of the circuit board 24, although only two first electrode layers 16 are shown in the figures. Further, a patterned ferroelectric layer 11 is laminated adjacent to each of the first electrode layers 16. The ferroelectric layer 11 has a higher dielectric constant than the insulating layer 18. Furthermore, a second electrode layer 22 is laminated over each ferroelectric layer 11 in such a manner that the ferroelectric layer 11 is sandwiched between the first electrode layer 16 and the second electrode layer 22. Thus, as can be seen in FIG. 8J, there can be obtained the circuit board 24 having in a surface portion thereof a plurality of by-pass capacitors 25 which are connected with a power source terminal of the semiconductor chip to be mounted.

Figure 8K:
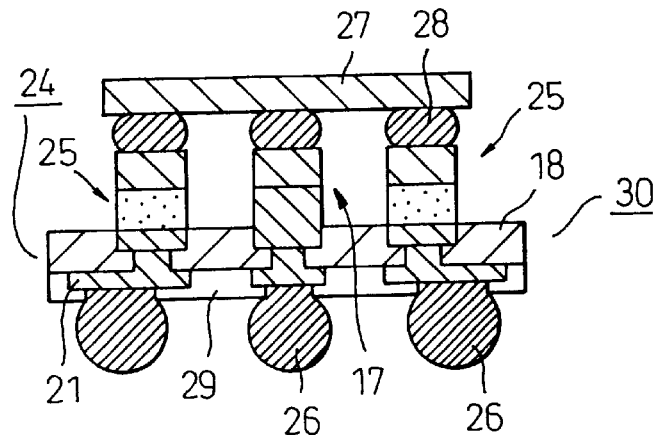

As is shown in FIG. 8K, corresponding to FIG. 2 described above, the circuit board 24 produced in accordance with the above-described production process can be further used to produce a semiconductor device 30. Namely, a solder ball (external connection terminal) 26 is applied to the wiring pattern 21 of the circuit board 24, while a semiconductor chip 27 is flip chip connected through a solder 28 to the second electrode layer 22 and the pad 17 of the by-pass capacitor 25. In this semiconductor device 30, the wiring pattern 21 is covered with a solder resist 29. In this instance, a solder ball was used as the external connection terminal, however, other conventional connection means such as a pin may be used as the external connection terminal, if desired.

It will be appreciated in FIG. 8K, and thus FIG. 2, that a plurality of by-pass capacitors 25 can be mounted in a packaging area of the semiconductor chip 27 of the circuit board 24, along with a pad 17 to be connected with a signal terminal of the semiconductor chip 27. Since the by-pass capacitors 25 are positioned just below the semiconductor chip 27, the generation of source noise can be prevented as a function of effective absorption of such a noise.

Figure 3:
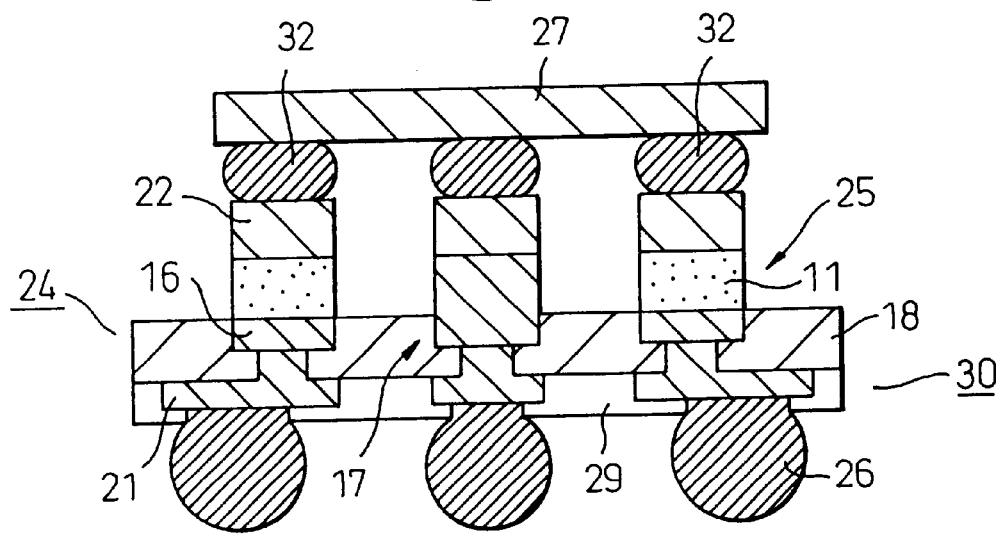
FIG. 3 is a cross-sectional view of the semiconductor device according to another preferred embodiment of the present invention.

FIG. 3 is a cross-sectional view of the semiconductor device according to another preferred embodiment of the present invention. Since the semiconductor device 30 has a structure similar to that of the semiconductor device 30 described above with reference to FIGS. 2 and 8K, to avoid duplication, the detailed explanations of the construction of the device and the parts or layers of the device will be omitted hereinafter. Further, to avoid confusion, the same or similar part or layer in the device 30 will be described referring to the same reference numeral in FIG. 3 and others, unless otherwise specified.

The semiconductor device 30 comprises a circuit board 24 and a semiconductor chip 27 mounted on the by-pass capacitors 25 of the circuit board 24. The by-pass capacitor 25 is formed on the insulating layer 18. The circuit board 24 has a wiring pattern 21. A lower surface of the wiring pattern 21 has a solder ball 26.

The by-pass capacitors 25 are positioned just below the semiconductor chip 27, and they are flip chip connected through a solder 32. As is described below, the solder 32 is produced from a solder layer which has been previously laminated as one member to a circuit board-providing article. Each by-pass capacitor 25 is constituted from a first electrode layer 16 formed in the uppermost insulating layer 18 of the circuit board 24, a ferroelectric layer 11 and a second electrode layer 22.

In addition to the by-pass capacitors 25, the circuit board 24 has a pad 17 also disposed in a mounting area of the semiconductor chip 27. The pad 17 is used for receiving and connecting a signal terminal of the semiconductor chip 27.

FIGS. 9A to 9L are cross-sectional views showing, in sequence, the preferred production process of the semiconductor device of FIG. 3. As can be appreciated from the following descriptions, the described production process is more simple and more useful in the reduction in size of the circuit board, and thus the semiconductor device, comparing to the above production process of FIGS. 8A to 8K.

Figure 9A:
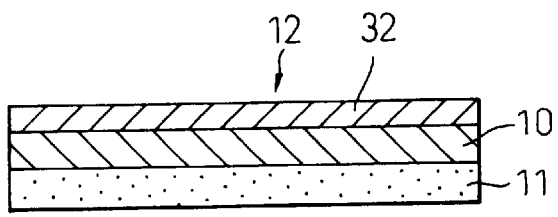
FIGS. 9A to 9L are cross-sectional views showing, in sequence, the production of the semiconductor device of FIG. 3.

First, as is shown in FIG. 9A, a circuit board-providing article 12 is prepared. The article 12 is made of a copper foil 10 and one surface of the copper foil 10 has applied thereon a layer 11 of the ferroelectric material. The ferroelectric layer 11 is preferably made of ferroelectric materials such as STO, PZT, tantalum oxide and barium titanate. Another surface, opposed to the ferroelectric layer 11, of the copper foil 10 has a solder layer 32. The solder layer 32 is fabricated in the below-mentioned step to form a soldering bump as a connection means. In the circuit board-providing article 12, any other metallic foil may be used in place of the copper foil 10, if desired.

Figure 9B:
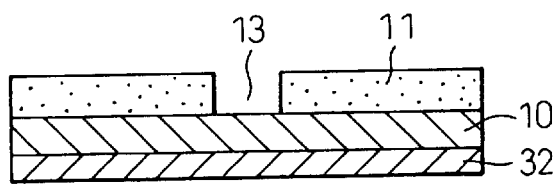

After preparation of the circuit board-providing article 12, as is shown in FIG. 9B, a pad-providing opening 13 is formed in the ferroelectric layer 11 to expose the underlying copper foil 10. A laser fabrication method is preferably used in the formation of the opening 13.

Figure 9C:
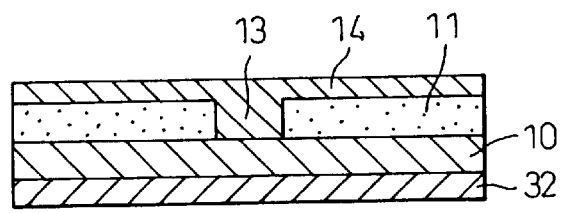

Thereafter, as is shown in FIG. 9C, the circuit board-providing article 12 is plated with copper by using an electroless copper plating or an electrolytic copper plating to form a first copper plating layer (hereinafter, also referred to as "conductor layer") 14. The pad-providing opening 13 is filled with, and the ferroelectric layer 11 is covered with, the first copper plating layer 14.

Figure 9D:
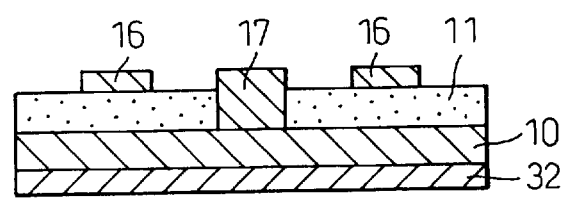

Then, the first copper plating layer 14, as is shown in FIG. 9D, is selectively etched off to form a first electrode layer 16, along with a pad 17.

Figure 9E:
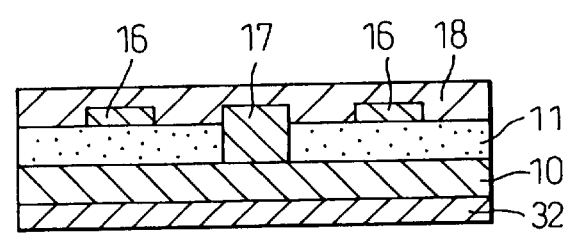

Next, as is shown in FIG. 9E, a first insulating layer 18 is applied over a surface of the ferroelectric layer 11 partially exposed as a result of the above selective etching. The first insulating layer 18 is preferably formed by coating a solution of a non-photosensitive resin such as polyimide or polyphenyleneether to, or adhering a sheet of such resin to, a surface of the ferroelectric layer 11.

Figure 9F:
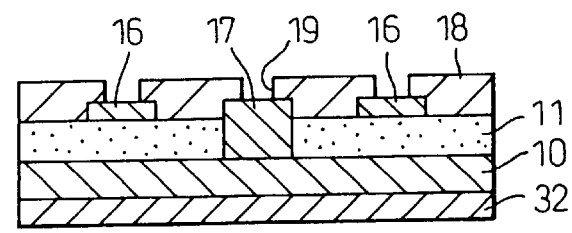

Next, as is shown in FIG. 9F, the first insulating layer 18 is selectively removed to form via hole 19. The formation of the via hole 19 is preferably carried out by using a laser fabrication method. As a result, the first electrode layer 16 and the pad 17 are exposed in the bottom section of the via hole 19. As mentioned above, a photolithographic process or other processes may be used in place of the laser fabrication method, if desired.

Figure 9G:
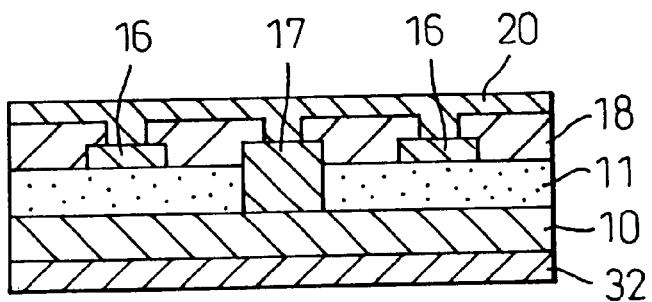

Thereafter, as is shown in FIG. 9G, a second copper plating layer (second conductor layer) 20 is formed over the first insulating layer 18. An electroless copper plating or an electrolytic copper plating is preferably used for this purpose. The resulting second copper plating layer 20 is electrically connecting with the first electrode layer 16 and the pad 17.

Figure 9H:
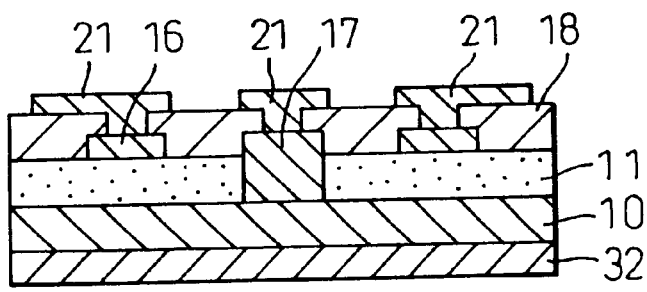

The second copper plating layer 20 is then selectively etched to form a wiring pattern 21, as is shown in FIG. 9H. The wiring pattern 21 is electrically connecting with the first electrode layer 16 and the pad 17.

In the formation of the wiring pattern 21, if necessary, the above-described steps of the formation of the insulating layer, via hole, copper plating layer and wiring pattern may be repeated to form a multilayed circuit board (not shown).

Figure 9I:
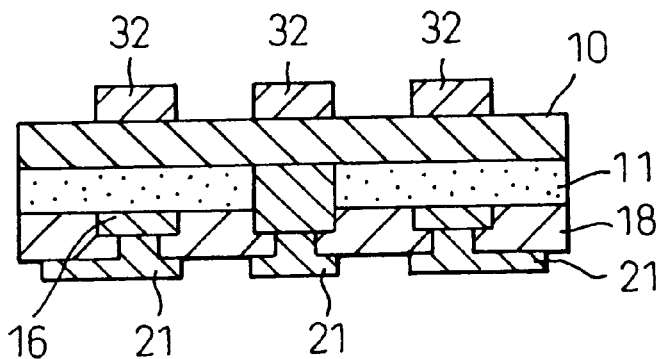

Following the formation of the wiring pattern 21, as is shown in FIG. 9I, a solder layer 32 is selectively etched to form a patterned solder layer 32. The pattern of the solder layer 32 corresponds to the pattern of the target by-pass capacitor, because it is used as a means for connecting the first electrode layer 16 and the pad 17 with a semiconductor chip. Any conventional etching methods may be used in this purpose. The resulting solder layer 32 is opposed through the copper foil 10 and the ferroelectric layer 11 to the first electrode layer 16.

Figure 9J:
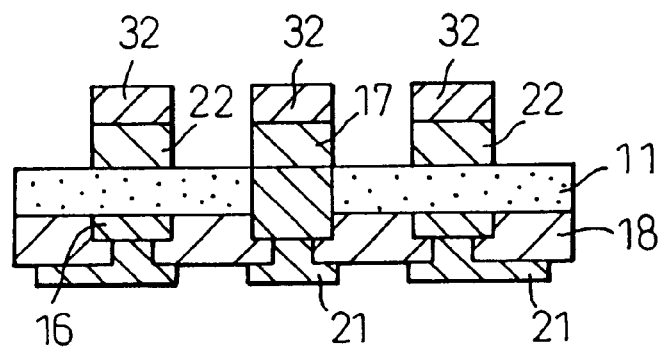

Next, as is shown in FIG. 9J, the copper foil 10 is selectively etched with a suitable etchant to form a second electrode layer 22. The resulting second electrode layer 22 is opposed through the ferroelectric layer 11 to the first electrode layer 16.

Figure 9K:
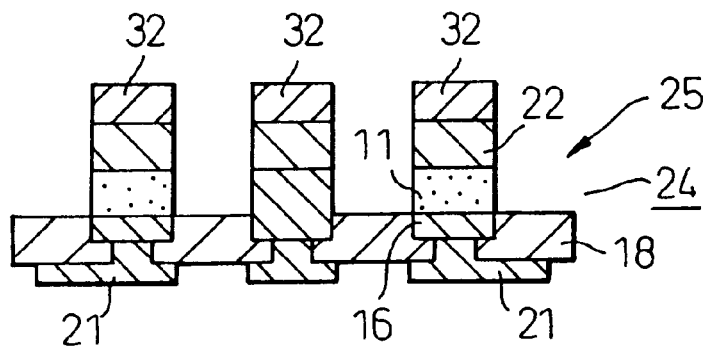

Next, as is shown in FIG. 9K, the ferroelectric layer 11 is selectively etched to form a patterned ferroelectric layer 11. Thus, a circuit board 24 having a by-pass capacitor 25 thereon is obtained.

In the formation of the patterned solder layer 32, the second electrode layer 22 and the patterned ferroelectric layer 11, it is preferred that different etchants are used in each of the etching processes so that the resulting pattern may be utilized as a masking means in the etching process of the underlying layer. For example, the patterned solder layer 32 can be used as a masking means in the etching of the copper foil 10, and the second electrode layer 22 can be used as a masking means in the etching of the ferroelectric layer 11.

In the resulting circuit board 24, a plurality of first electrode layers 16 are formed on the uppermost insulating layer (first insulating layer) 18 of the circuit board 24, a patterned ferroelectric layer 11 is laminated adjacent to each of the first electrode layers 16. The ferroelectric layer 11 has a higher dielectric constant than the insulating layer 18. Further, a second electrode layer 22 is laminated over each ferroelectric layer 11. As a result, the ferroelectric layer 11 is sandwiched between the first electrode layer 16 and the second electrode layer 22. Thus, as can be seen in FIG. 9K, there can be obtained the circuit board 24 having in a surface portion thereof a plurality of by-pass capacitors 25. The by-pass capacitors 25 are connected through the patterned solder layer 32, retained on the second electrode layer 22, with a power source terminal of the semiconductor chip.

Figure 9L:
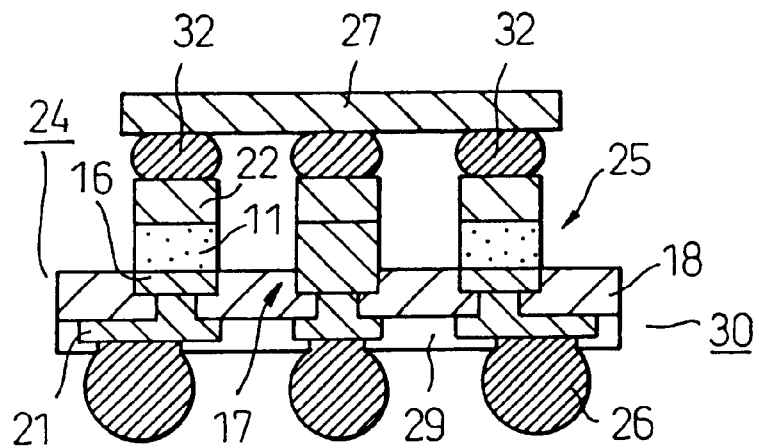

As is shown in FIG. 9L, the circuit board 24 produced in accordance with the above-described production process can be used to produce a semiconductor device 30. Namely, a solder ball (external connection terminal) 26 is applied to the wiring pattern 21 of the circuit board 24, while a semiconductor chip 27 is flip chip connected through a patterned solder layer 32 to the second electrode layer 22 and the pad 17 of the by-pass capacitor 25. In this semiconductor device 30, the wiring pattern 21 is covered with a solder resist 29. In the illustrated semiconductor device 30, any other connection means such as pin may be used in place of the solder ball 26, if desired.

It will be appreciated in FIG. 9L, a plurality of by-pass capacitors 25 can be mounted in a packaging area of the semiconductor chip 27 of the circuit board 24, along with a pad 17. Since the by-pass capacitors 25 are positioned just below the semiconductor chip 27, the generation of source noise can be prevented as a function of effective absorption of such a noise.

In the practice of the present invention, the production process described above, referring to FIGS. 9A to 9G, may be modified as is described below with reference to FIGS. 10A to 10M in which a circuit board-providing article having no solder layer is used, and a solder layer is applied to the article during the production process. Apparently, both production processes are substantially the same except that the function of the copper foil 10 was substituted with the function of the first copper plating layer 14. Therefore, the production process shown in FIGS. 10A to 10M will be described briefly.

Figure 10A:
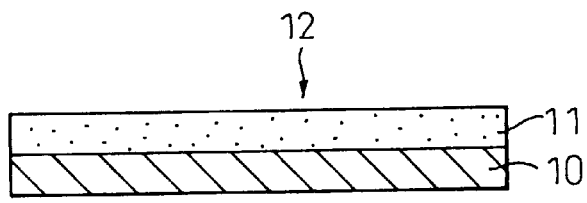
FIGS. 10A to 10M are cross-sectional views showing, in sequence, a modification of the production process of the semiconductor device of FIG. 3.

First, as is shown in FIG. 10A, a circuit board-providing article 12 comprising a metallic foil 10 having laminated to one surface thereof a layer 11 of the ferroelectric material. In this instance, the metallic foil 10 is made of a copper foil and the ferroelectric layer 11 is made of strontium titanate, while other materials may be used, if desired, as described above.

Figure 10B:
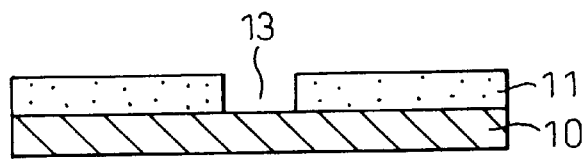

Then, as is shown in FIG. 10B, a pad-providing opening 13 is formed in the ferroelectric layer 11 to expose a surface of the underlying copper foil 10. The opening 13 is preferably formed by a laser fabrication method.

Figure 10C:
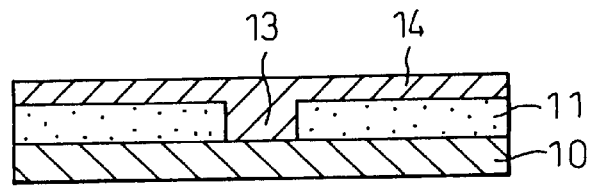

Next, as is shown in FIG. 10C, the ferroelectric layer 11 is plated with an electrically conductive metal to form a first conductor layer 14. In this instance, copper is used as the electrically conductive metal, and thus an electroless copper plating or an electrolytic copper plating is preferably used. As a result, the opening 13 of the ferroelectric layer 11 is filled with copper, in addition to covering a surface of the ferroelectric layer 11 with a first copper plating layer 14.

Figure 10D:
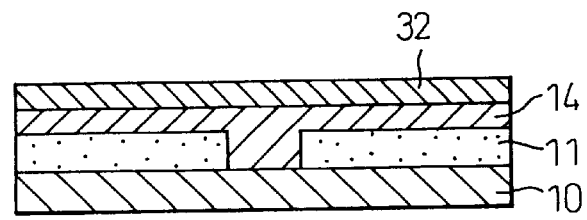

Next, the first copper plating layer 14 is overcoated with a solder layer 32. The solder layer 32 is preferably formed by plating, as is shown in FIG. 10D.

Figure 10E:
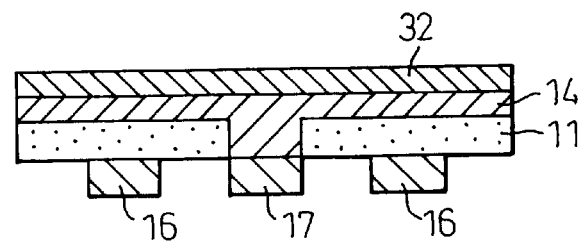

Following the formation of the solder layer 32, the copper foil 10 opposed to the solder layer 32 with regard to the ferroelectric layer 11 is selectively etched to form the first electrode layer 16 and the pad 17, as is shown in FIG. 10E.

Figure 10F:
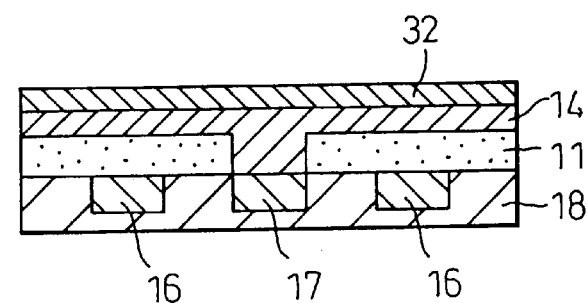

Thereafter, as is shown in FIG. 10F, an electrically insulating material such as polyimide resin is coated and cured over the ferroelectric layer 11 to form a first insulating layer 18.

Figure 10G:
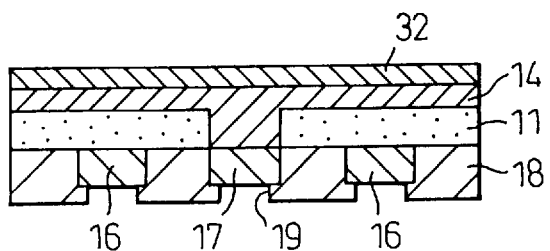

The first insulating layer 18 is then selectively etched to form a wiring-providing opening 19, as is shown in FIG. 10G. The first electrode layer 16 is thus exposed in the opening 19 of the first insulating layer 18.

Figure 10H:
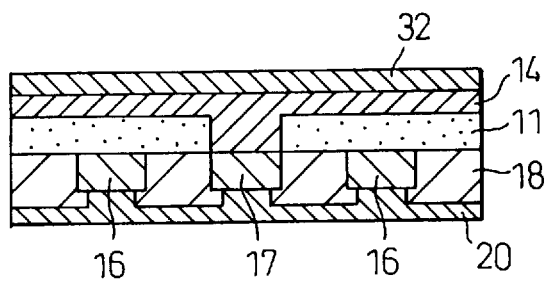

After the formation of the wiring-providing opening 19, as is shown in FIG. 10H, a surface of the etched first insulating layer 18 is plated with an electrically conductive metal, preferably, copper, to form a second conductor layer (second copper plating layer) 20. As in the above-described step for forming the first electrode layer 16, an electroless copper plating or an electrolytic copper plating is preferably used.

Figure 10I:
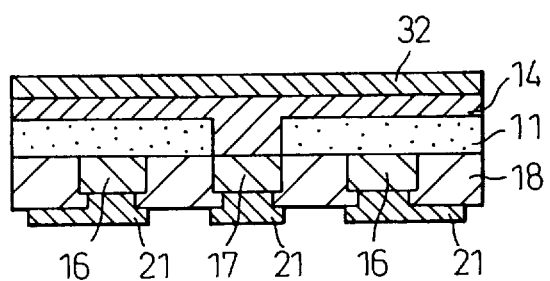

Thereafter, as is shown in FIG. 10I, a wiring pattern 21 is formed by selectively etching the second copper plating layer 20. The wiring pattern 21 connecting the first electrode layer 16 and the pad 17 is thus obtained.

Figure 10J:
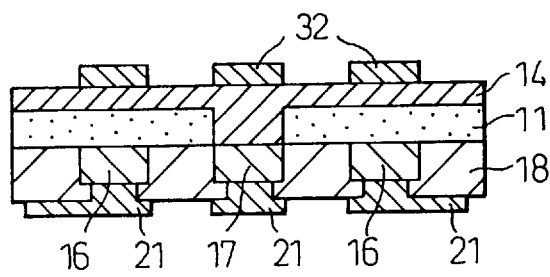

Following the formation of the wiring pattern 21, the formation of by-pass capacitors is started. As is shown in FIG. 10J, the solder layer 32 is selectively etched to form a patterned solder layer 32. The patterned solder layer 32 can act as a soldering means for receiving and connecting a semiconductor element in the resulting semiconductor device. As can be seen in this figure, the patterned solder layer 32 is opposed through the first conductor layer (first copper plating layer) 14 and the ferroelectric layer 11 to the first electrode layer 16.

Figure 10K:
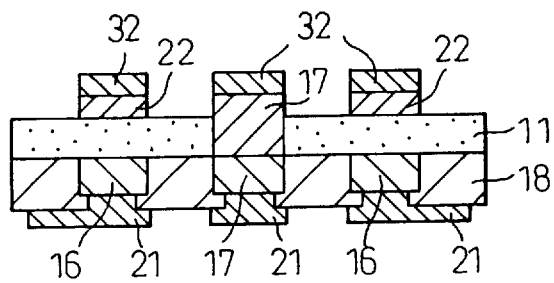

Next, as is shown in FIG. 10K, the first conductor layer 14 exposed as a result of the formation of the patterned solder layer 32 is etched off to form a second electrode layer 22. The profile of the second electrode layer 22 is identical with that of the patterned solder layer 32, and is opposed through the ferroelectric layer 11 to the first electrode layer 16.

Figure 10L:
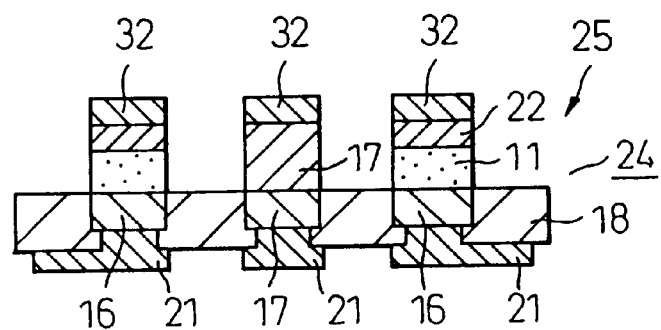

Similarly, as is shown in FIG. 10L, the exposed ferroelectric layer 11 is etched off to form a patterned ferroelectric layer 11. Thus, as is illustrated, by-pass capacitors 25, each having a sandwich structure of the first electrode layer 16, the patterned ferroelectric layer 11 and the second electrode layer 22 are formed on the circuit board 24. The second electrode layer 22 further has the patterned solder layer 32 for use as a soldering means between the circuit board 24 and a semiconductor element.

Figure 10M:
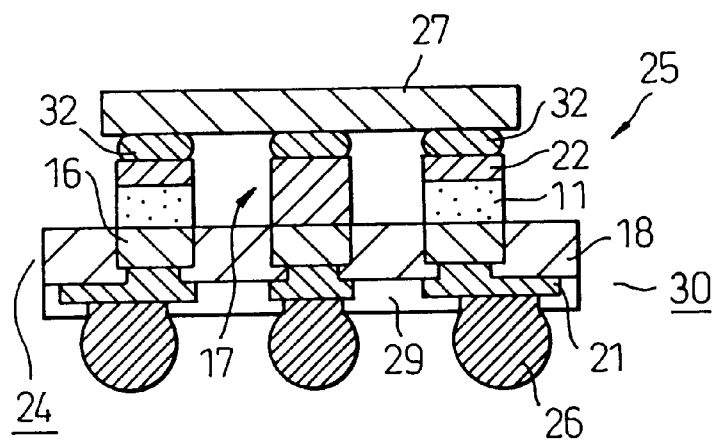

Finally, as is shown in FIG. 10M, a solder ball (external connection terminal) 26 is applied to the wiring pattern 21 of the circuit board 24, while a semiconductor chip 27 is flip chip connected through a patterned solder layer 32 to the second electrode layer 22 and the pad 17 of the by-pass capacitor 25. In this semiconductor device 30, the wiring pattern 21 is covered with a solder resist 29. Since the by-pass capacitors 25 are positioned just below the semiconductor chip 27, the generation of the source noise can be prevented because of effective absorption of such a noise.

Figure 4:
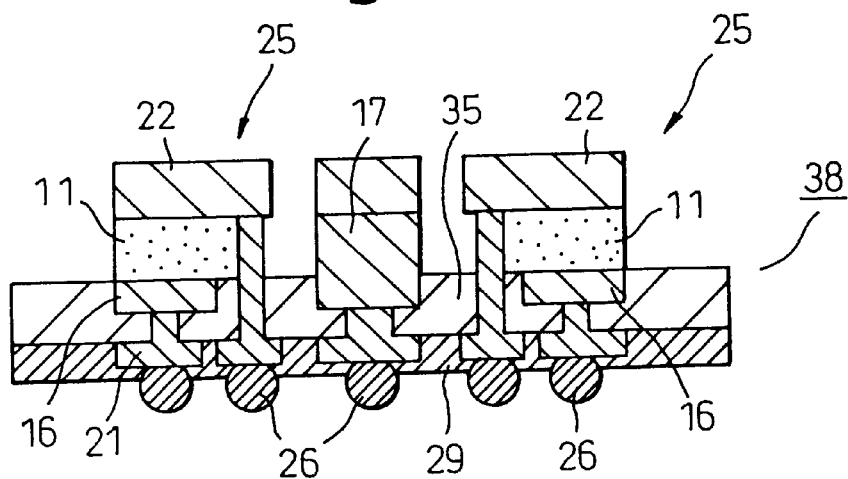
FIG. 4 is a cross-sectional view of the circuit board according to one preferred embodiment of the present invention.

FIG. 4 is a cross-sectional view of the circuit board according to one preferred embodiment of the present invention. Since the circuit board has a structure similar to that of the circuit boards described above with reference to FIGS. 2 and 3, the detailed explanations of the construction of the device and the parts or layers of the device will be omitted hereinafter, and the same or similar part or layer in the circuit board will be described referring to the same reference numeral.

The circuit board 38 has by-pass capacitors 25 on a surface portion thereof. The by-pass capacitor 25 is formed on the second insulating layer 25. The circuit board 38 has a wiring pattern 21. A lower surface of the wiring pattern 21 has a solder ball 26.

The by-pass capacitors 25 are designed to be positioned just below a semiconductor chip (not shown). They are flip chip connected through solder (not shown) to the semiconductor chip. Each by-pass capacitor 25 is constituted from a first electrode layer 16 formed in the uppermost and second insulating layer 35 of the circuit board 38, a ferroelectric layer 11 and a second electrode layer 22. Further, the second electrode layer 22 is electrically connected with the wiring pattern 21.

The circuit board 38 has a pad 17 also disposed in a mounting area of the semiconductor chip. The pad 17 s used for receiving and connecting a signal terminal of the semiconductor chip.

FIGS. 11A to 11I are cross-sectional views showing, in sequence, the production process of the circuit board 38 of FIG. 4.

Figure 11A:
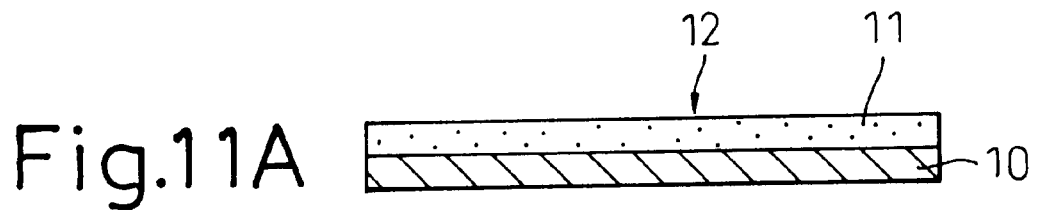
FIGS. 11A to 11I are cross-sectional views showing, in sequence, the production of the circuit board of FIG. 4.

First, as is shown in FIG. 11A, a circuit board-providing article 12 is prepared. The article 12 is made of a copper foil 10 and one surface of the copper foil 10 has applied thereon a layer 11 of the ferroelectric material. As described above, the ferroelectric layer 11 may be made of any conventional ferroelectric materials such as STO, PZT, tantalum oxide and barium titanate. In the circuit board-providing article 12, any one of other metallic foils may be used in place of the copper foil 10, if desired.

Figure 11B:
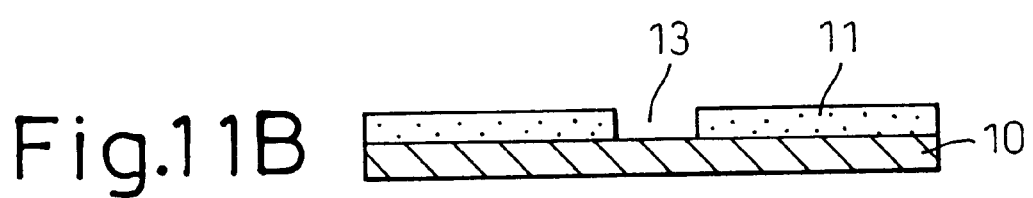

Next, as is shown in FIG. 11B, a pad-providing opening 13 is formed in the ferroelectric layer 11 to expose the underlying copper foil 10. A laser fabrication method is preferably used in the formation of the opening 13.

Figure 11C:
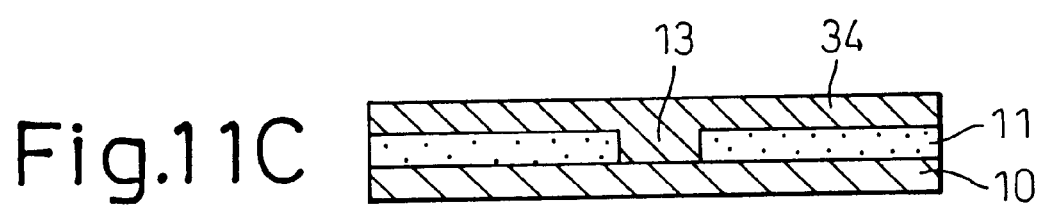

Then, as is shown in FIG. 11C, copper plating is applied over the circuit board-providing article 12 to form a third copper plating layer (hereinafter, also referred to as a "conductor layer") 34. The pad-providing opening 13 is filled with, and the ferroelectric layer 11 is covered with, the third copper plating layer 34. Copper plating is preferably carried out by using an electroless copper plating or an electrolytic copper plating.

Figure 11D:
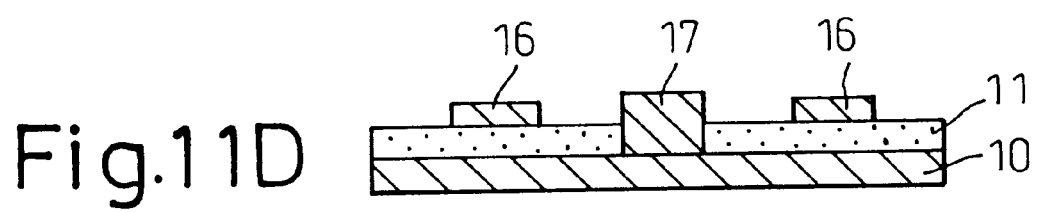

Following the formation of the third copper plating layer 34, as is shown in FIG. 11D, the third copper plating layer 34 is selectively etched to form a first electrode layer 16, along with a pad 17.

Figure 11E:
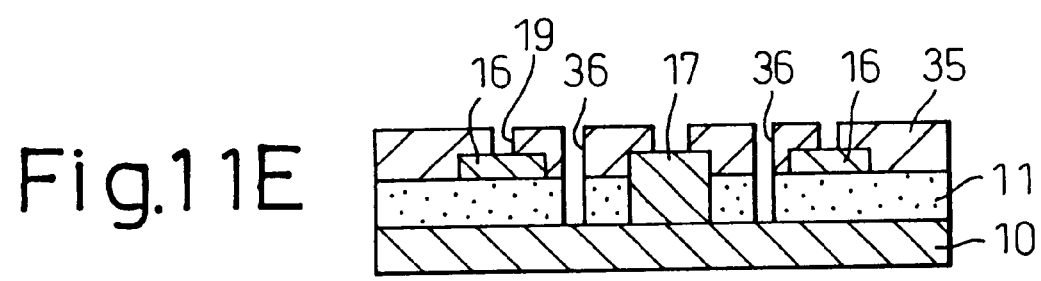
Figure 11F:
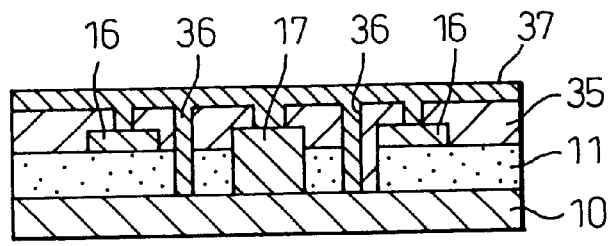

Next, as is shown in FIG. 11E, a second insulating layer 35 is applied over a surface of the ferroelectric layer 11 partially exposed as a result of the above selective etching. The second insulating layer 35 is preferably formed by coating a solution of a non-photosensitive resin such as polyimide or polyphenyleneether to, or adhering a sheet of such resin to, a surface of the ferroelectric layer 11. Then, the second insulating layer 35 is laser fabricated to form via holes 19, thereby exposing the first electrode layer 16 and the pad 17. At the same time, holes 36 passed through the second insulating layer 35 and the ferroelectric layer 11 are formed near each of the first electrode layers 16. In this process, in combination with the laser fabrication method, a photolithographic process may be used, if desired. That is, after the second insulating layer 35 was formed from a photosensitive and electrically insulating resist material, the layer 35 is photolithographically etched off to form via holes 19 and laser fabricated to form holes 36.

Thereafter, as is shown in FIG. 11E, a fourth copper plating layer (fourth conductor layer) 37 is formed over the second insulating layer 35. An electroless copper plating or an electrolytic copper plating is preferably used for this purpose. The resulting fourth copper plating layer 37 is filled into the via holes 19 and the holes 36, in addition to covering of the layer 35, and is also electrically connecting with the first electrode layer 16 and the pad 17.

Figure 11G:
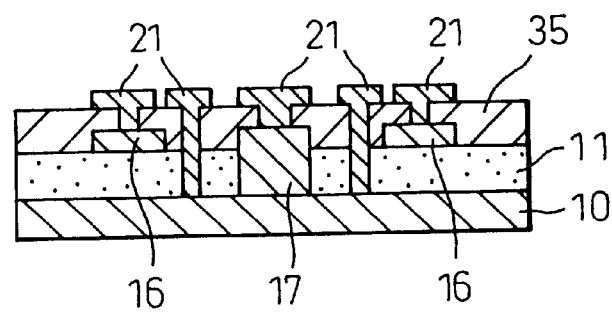

The fourth copper plating layer 37 is then selectively etched to form a wiring pattern 21, as is shown in FIG. 11G. The wiring pattern 21 is electrically connecting with the first electrode layer 16 and the pad 17.

In the formation of the wiring pattern 21, if necessary, the above-described steps of the formation of the insulating layer, via holes and holes, copper plating layer and wiring pattern may be repeated to form a multilayed circuit board (not shown).

Figure 11H:
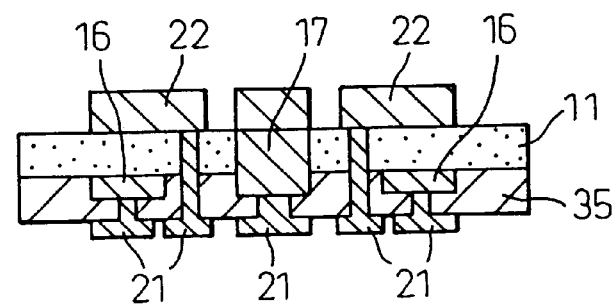

Following the formation of the wiring pattern 21, as is shown in FIG. 11H, a copper foil 10 is selectively etched to form a second electrode layer 22.

Figure 11I:
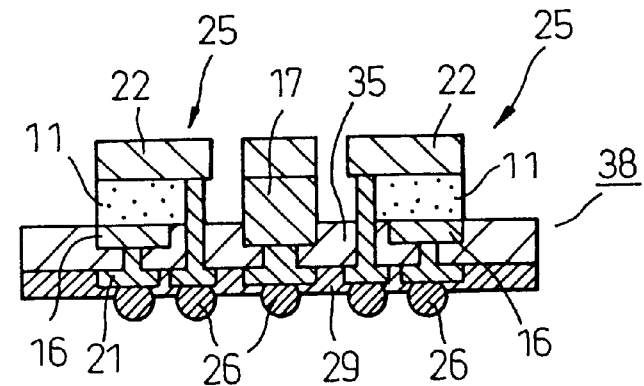

Thereafter, as is shown in FIG. 11I, the ferroelectric layer 11, a part of which was exposed as a result of the selective etching of the copper foil 10, is further etched to form a patterned ferroelectric layer 11. Thus, a circuit board 38 having by-pass capacitors 25 on a surface portion thereof is obtained.

In the formation of the second electrode layer 22 and the patterned ferroelectric layer 11, it is preferred that different etchants are used in each of the etching processes so that the resulting pattern may be utilized as a masking means in the etching of the underlying layer. For example, in the etching of the ferroelectric layer 11, the previously formed second electrode layer 22 can be effectively used as a masking means.

Although not shown, the circuit board 38 produced in accordance with the above-described production process can be further used to produce a semiconductor device. Namely, a solder ball (external connection terminal) 26 is applied to the wiring pattern 21 of the circuit board 38, while a semiconductor chip is flip chip connected through a solder (not shown) to the second electrode layer 22 and the pad 17 of the by-pass capacitor 25. In the resulting semiconductor device, the wiring pattern 21 is covered with a solder resist 29. Generally, a solder ball is used as the external connection terminal, however, other conventional connection means such as pin may be used as the external connection terminal, if desired.

It will be appreciated in FIG. 11I that a plurality of by-pass capacitors 25 can be mounted in a packaging area of the semiconductor chip of the circuit board 38, along with a pad 17 to be connected with a signal terminal of the semiconductor chip. Since the by-pass capacitors 25 can be positioned just below the semiconductor chip, the generation of the source noise can be effectively prevented.

In the above-described production process of the circuit board 38, a circuit board-providing article 12 made of a copper foil 10 and a ferroelectric layer 11 was used as the starting material. However, if desired, a circuit board-providing article 12 comprising a solder layer in addition to the copper foil 10 and the ferroelectric layer 11 may be used as in the production process described with reference to FIGS. 9A to 9I, or a solder layer may be applied to the circuit board-providing article 12 during the production of the circuit board as in the production process described with reference to FIGS. 10A to 10M.

FIG. 5 is a cross-sectional view of the circuit board according to another preferred embodiment of the present invention. Since the circuit board has a structure similar to that of the circuit boards described above with reference to FIGS. 2 to 4, the detailed explanations of the construction of the device and the parts or layers of the device will be omitted hereinafter, and the same or similar part or layer in the circuit board will be described referring to the same reference numeral.

The circuit board 47 has by-pass capacitors 25 on a surface portion thereof. The by-pass capacitor 25 is formed on the third insulating layer 43. The circuit board 47 has a wiring pattern 21. A lower surface of the wiring pattern 21 has a solder ball 26.

The by-pass capacitors 25 are designed to be positioned just below a semiconductor chip (not shown). They are flip chip connected through solder (not shown) to the semiconductor chip. Each by-pass capacitor 25 is constituted from a first electrode layer 16 formed in the uppermost and third insulating layer 43 of the circuit board 47, an insulating layer 41, a ferroelectric layer 11 and a second electrode layer 22. Further, the second electrode layer 22 is electrically connected with the wiring pattern 21.

The circuit board 47 has a pad 17 also disposed in a mounting area of the semiconductor chip. The pad 17 is used for receiving and connecting a signal terminal of the semiconductor chip.

FIGS. 12A to 12G are cross-sectional views showing, in sequence, the production process of the circuit board of FIG. 5.

Figure 12A:
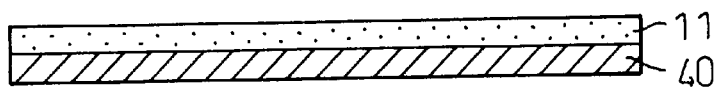
FIGS. 12A to 12G are cross-sectional views showing, in sequence, the production of the circuit board of FIG. 5.
Figure 12B:
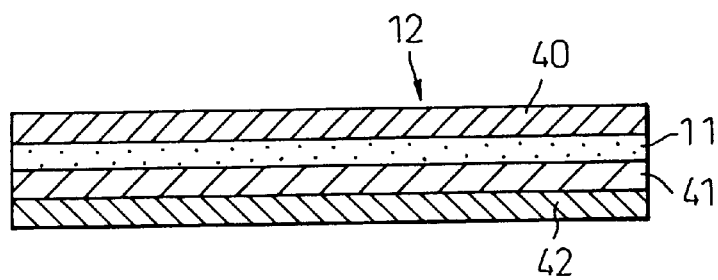

First, as is shown in FIG. 12B, a circuit board-providing article 12 is prepared. The article 12 has a laminated structure of a first copper foil 40, a layer 11 of the ferroelectric material, a sandwiched insulating layer 41 and a second copper layer 42. The ferroelectric layer 11 may be made of any conventional ferroelectric materials such as STO, PZT, tantalum oxide and barium titanate. The insulating layer 41 may be a metal oxide layer or a resin layer such as polyimide, for example.

Alternatively, a circuit board-providing article 12 comprising a copper foil 40 and a layer 11 of the ferroelectric material shown in FIG. 12A may be used as the starting material. In this case, a second copper foil 42 is laminated through an adhesive insulating layer 41 to the ferroelectric layer 11 of the article 12 to complete a laminated article 12 having the structure similar to that of the article of FIG. 12B.

Figure 12C:
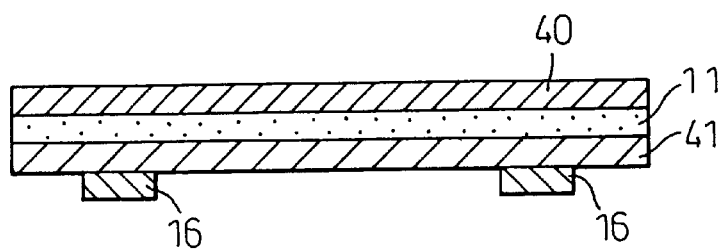

Next, as is shown in FIG. 12C, the second copper foil 42 is selectively etched to form a first electrode layer 16.

Figure 12D:
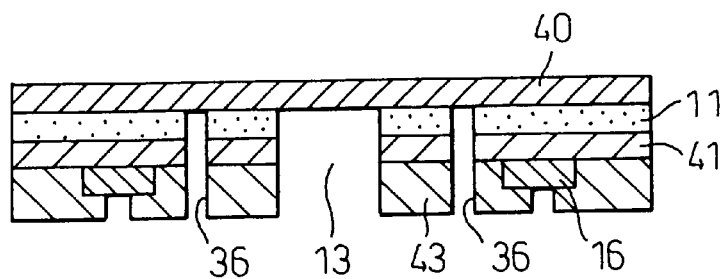

Next, as is shown in FIG. 12D, a third insulating layer 43 is applied to cover the first electrode layer 16 and the underlying exposed insulating layer 41. Then, the third insulating layer 43, the insulating layer 41 and the ferroelectric layer 11 are bored to form holes 36 near the first electrode layer 16, along with a pad-providing opening 13. At the same time, a wiring-providing hole is formed in the third insulating layer 43 in such a manner that a wiring site of the first electrode layer 16 is exposed through the hole. A laser fabrication method is suitable as the boring means.

Figure 12E:
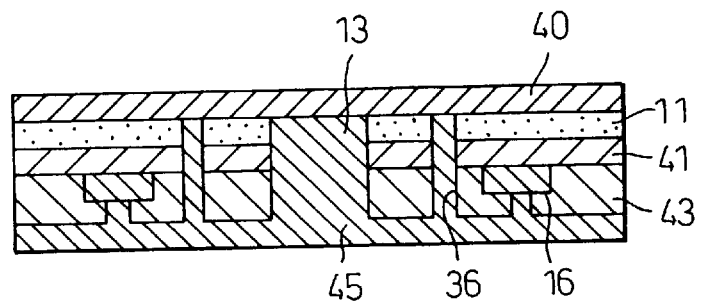

Then, as is shown in FIG. 12E, copper plating is applied over the bored third insulating layer 43 to form a fifth copper plating layer (conductor layer) 45. The pad-providing opening 13, holes 36 and wiring-providing holes are filled with and the third insulating layer 43 is covered with the fifth copper plating layer 45. Copper plating is preferably carried out by using an electroless copper plating or an electrolytic copper plating.

Figure 12F:
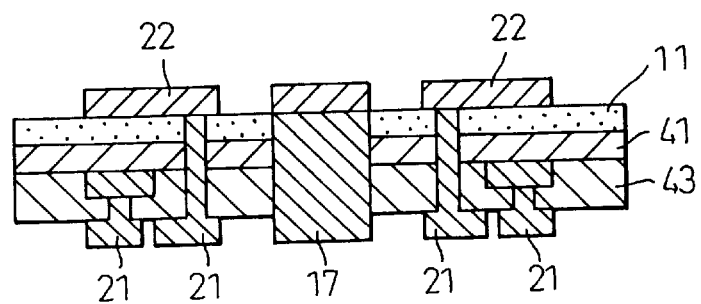

Following the formation of the fifth copper plating layer 45, as is shown in FIG. 12F, the fifth copper plating layer 45 is selectively etched to form a wiring pattern 21, along with a pad 17. The resulting wiring pattern 21 is connected with each of the first electrode layer 16 and the first copper foil 40. Before, during or after the formation of the wiring pattern 21, the first copper foil 40 is also selectively etched to form a second electrode layer 22.

In the formation of the wiring pattern 21, if necessary, the above-described steps of the formation of the insulating layer, via holes, copper plating layer and wiring pattern may be repeated to form a multilayed circuit board (not shown).

Figure 12G:
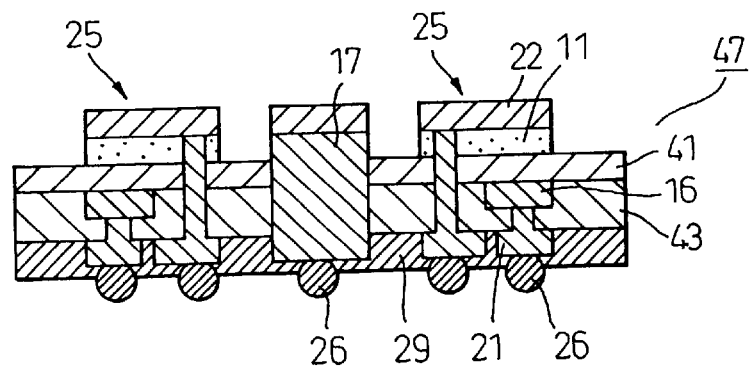

Following the formation of the wiring pattern 21, as is shown in FIG. 12G, the ferroelectric layer 11, a part of which was exposed as a result of the selective etching of the first copper foil 40, is further etched to form a patterned ferroelectric layer 11. Thus, a circuit board 47 having by-pass capacitors 25 on a surface portion thereof is obtained.

In the formation of the second electrode layer 22 and the patterned ferroelectric layer 11, it is preferred that different etchants are used in each of the etching processes so that the resulting pattern may be utilized as a masking means in the etching of the underlying layer. For example, in the etching of the ferroelectric layer 11, the previously formed second electrode layer 22 can be effectively used as a masking means.

Although not shown, the circuit board 47 produced in accordance with the above-described production process can be further used to produce a semiconductor device. Namely, a solder ball (external connection terminal) 26 is applied to the wiring pattern 21 of the circuit board 47, while a semiconductor chip is flip chip connected through a solder (not shown) to the second electrode layer 22 and the pad 17 of the by-pass capacitor 25. In the resulting semiconductor device, the wiring pattern 21 is covered with a solder resist 29. Generally, a solder ball is used as the external connection terminal, however, other conventional connection means such as a pin may be used as the external connection terminal, if desired.

It will be appreciated in FIG. 12G that a plurality of by-pass capacitors 25 can be mounted in a packaging area of the semiconductor chip of the circuit board 47, along with a pad 17 to be connected with a signal terminal of the semiconductor chip. Since the by-pass capacitors 25 can be positioned just below the semiconductor chip, the generation of the source noise can be effectively prevented.

In the above-described production process of the circuit board 47, different types of the circuit board-providing articles can be used. For example, in place of the circuit board-providing article 12 illustrated in FIGS. 12A and 12B, a circuit board-providing article 12 comprising a solder layer in addition to the copper foil 10 and the ferroelectric layer 11 may be used as in the production process described with reference to FIGS. 9A to 9I, or a solder layer may be applied to the circuit board-providing article 12 during the production of the circuit board as in the production process described with reference to FIGS. 10A to 10M.

FIG. 6 is a cross-sectional view of the semiconductor device according to still another preferred embodiment of the present invention. Since the semiconductor device 52 has the structure similar to that of the semiconductor device 30 described above with reference to FIGS. 2 and 3, the detailed explanations of the construction of the device and the parts or layers of the device will be omitted. Further, the same or similar part or layer in the device 30 will be described referring to the same reference numeral, unless otherwise specified.

The semiconductor device 52 comprises a circuit board 51 and a semiconductor chip 27 mounted on the by-pass capacitors 25 of the circuit board 51. The by-pass capacitor 25 is formed on the fourth insulating layer 49. The circuit board 51 has a wiring pattern 21. A lower surface of the wiring pattern 21 has a solder ball 26.

The by-pass capacitors 25 are positioned just below the semiconductor chip 27, and they are flip chip connected through a second electrode layer 22 and a pad 17. As is described below, the second electrode layer 22 and the pad 17 are produced from a solder layer applied to a circuit board-providing article at the initial stage of the production process. Each by-pass capacitor 25 is constituted from a first electrode layer 16 formed in the uppermost insulating layer 49 of the circuit board 51 a patterned ferroelectric layer 11 and a second electrode layer 22.

In addition to the by-pass capacitors 25, the circuit board 51 has a pad 17 also disposed in a mounting area of the semiconductor chip 27. The pad 17 is used for receiving and connecting a signal terminal of the semiconductor chip 27.

FIGS. 13A to 13K are cross-sectional views showing, in sequence, the preferred production process of the semiconductor device of FIG. 6.

Figure 13A:
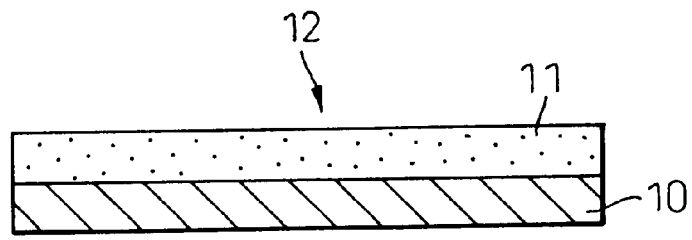
FIGS. 13A to 13K are cross-sectional views showing, in sequence, the production of the semiconductor device of FIG. 6.

First, as is shown in FIG. 13A, a circuit board-providing article 12 is prepared. The article 12 is a laminate of a copper foil 10 and a layer 11 of the ferroelectric material. The ferroelectric layer 11 is preferably made of ferroelectric materials such as STO, PZT, tantalum oxide and barium titanate.

Figure 13B:
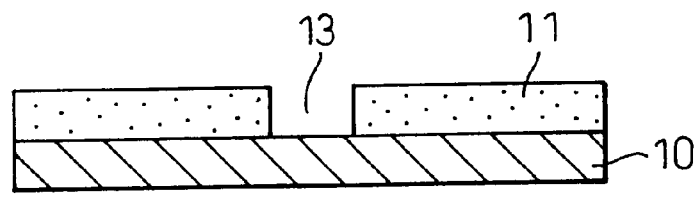

After preparation of the circuit board-providing article 12, as is shown in FIG. 13B, a pad-providing opening 13 is formed in the ferroelectric layer 11 to expose the underlying copper foil 10. Laser fabrication method is preferably used in the formation of the opening 13.

Figure 13C:
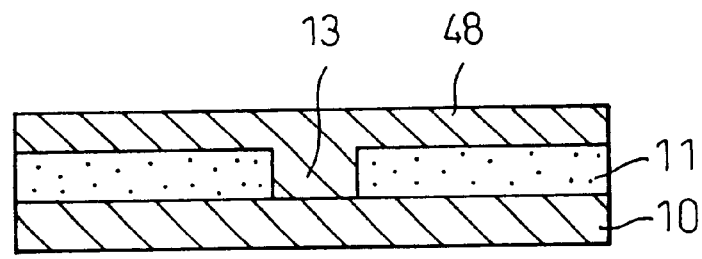

Thereafter, as is shown in FIG. 13C, the circuit board-providing article 12 is plated with a solder to form a solder layer 48. The pad-providing opening 13 is filled with and the ferroelectric layer 11 is covered with the solder layer 48.

Figure 13D:
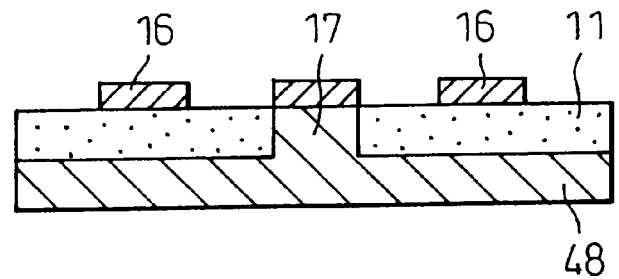

Then, the copper foil 10, as is shown in FIG. 13D, is selectively etched off to form a first electrode layer 16, along with a pad 17.

Figure 13E:
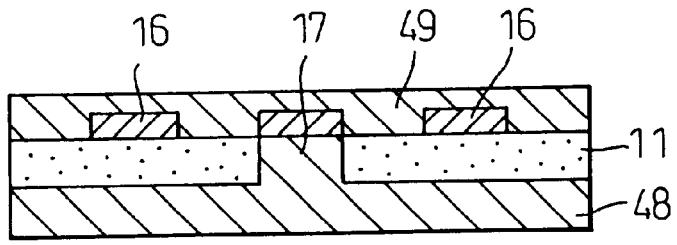

Next, as is shown in FIG. 13E, a fourth insulating layer 49 is applied over a surface of the ferroelectric layer 11 partially exposed as a result of the above selective etching. The fourth insulating layer 49 is preferably formed by coating a solution of a non-photosensitive resin such as polyimide or polyphenyleneether to or adhering a sheet of such resin to a surface of the ferroelectric layer 11.

Figure 13F:
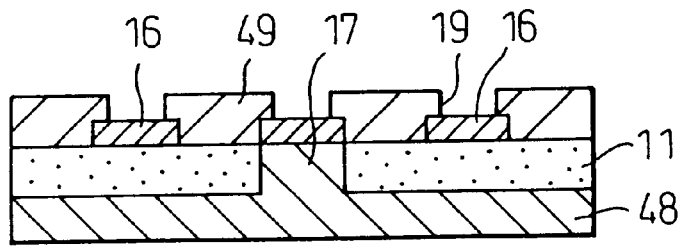

Next, as is shown in FIG. 13F, the fourth insulating layer 49 is selectively removed to form via holes 19. The formation of the via holes 19 is preferably carried out by using a laser fabrication method. As a result, the first electrode layer 16 and the pad 17 are exposed in the bottom section of the via holes 19. As mentioned above, a photolithographic process or other processes may be used in place of the laser fabrication method, if desired. For example, in the photolithographic process, a photosensitive and insulating resist material is used in the formation of the fourth insulating layer 49.

Figure 13G:
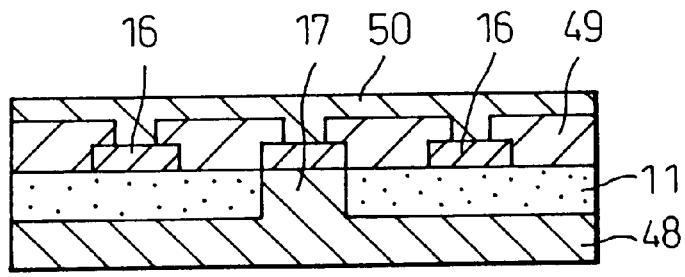

Thereafter, as is shown in FIG. 13G, a sixth copper plating layer 50 is formed over the fourth insulating layer 49. An electroless copper plating or an electrolytic copper plating is preferably used for this purpose. The resulting sixth copper plating layer 50 is electrically connecting with the first electrode layer 16 and the pad 17.

Figure 13H:
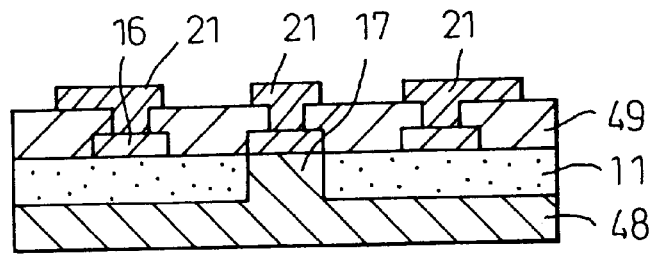

The sixth copper plating layer 50 is then selectively etched to form a wiring pattern 21, as is shown in FIG. 13H. The wiring pattern 21 is electrically connecting with the first electrode layer 16 and the pad 17.

In the formation of the wiring pattern 21, if necessary, the above-described steps of the formation of the insulating layer, the via hole, the copper plating layer and the wiring pattern may be repeated to form a multilayed circuit board (not shown).

Figure 13I:
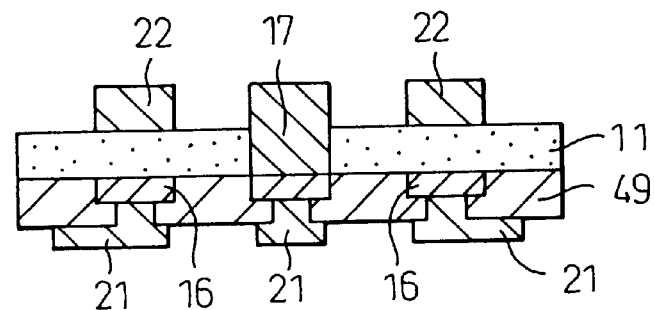

Following the formation of the wiring pattern 21, the formation of by-pass capacitors is started. As is shown in FIG. 13I, the solder layer 48 is selectively etched to form a second electrode layer 22 and a pad 17. The second electrode layer 22 and the pad 17 also can act as a soldering means for receiving and connecting a semiconductor element in the resulting semiconductor device.

Figure 13J:
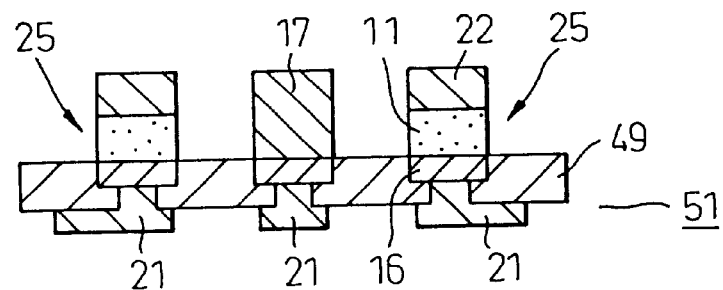

Next, as is shown in FIG. 13J, the ferroelectric layer 11 partially exposed as a result of the formation of the second electrode layer 22 and the pad 17 is etched off to form a patterned ferroelectric layer 11. Thus, as is illustrated, by-pass capacitors 25, each having a sandwich structure of the first electrode layer 16, the patterned ferroelectric layer 11 and the second electrode layer 22 are formed on the circuit board 51.

In the formation of the second electrode layer 22 and the patterned ferroelectric layer 11, it is preferred that different etchants are used in each of the etching processes so that the resulting pattern may be utilized as a masking means in the etching of the underlying layer. For example, in the etching of the ferroelectric layer 11, the previously formed second electrode layer 22 can be effectively used as a masking means.

Figure 13K:
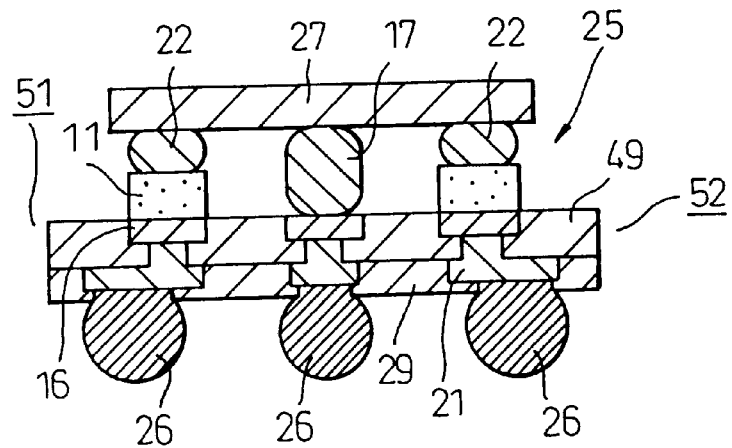

Finally, as is shown in FIG. 13K, corresponding to FIG. 6, a solder ball (external connection terminal) 26 is applied to the wiring pattern 21 of the circuit board 51, while a semiconductor chip 27 is flip chip connected to the second electrode layer 22 and the pad 17, both acting as a soldering means, of the by-pass capacitor 25. The semiconductor device 30 is thus obtained. In the semiconductor device 30, the wiring pattern 21 is covered with a solder resist 29. The solder ball 26 may be replaced with any other connecting means such as a pin, if desired.

It will be appreciated in FIG. 13K that a plurality of by-pass capacitors 25 can be mounted in a packaging area of the semiconductor chip 27 of the circuit board 51, along with a pad 17 to be connected with a signal terminal of the semiconductor chip 27. Since the by-pass capacitors 25 can be positioned just below the semiconductor chip 27, the generation of source noise can be prevented because of effective absorption of such a noise.

Figure 7:
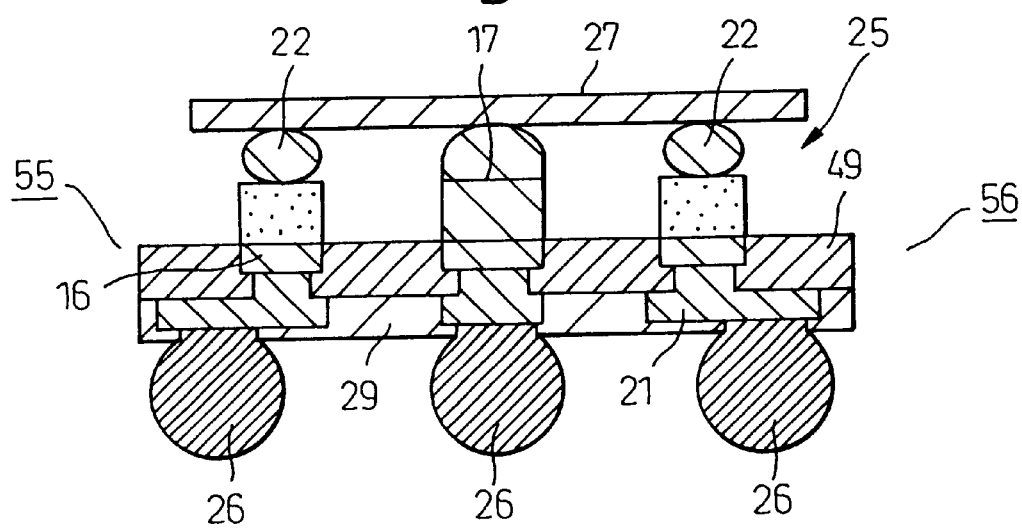
FIG. 7 is a cross-sectional view of the semiconductor device according to still another preferred embodiment of the present invention.

FIG. 7 is a cross-sectional view of the semiconductor device according to still another preferred embodiment of the present invention. Since the semiconductor device 56 has a structure similar to that of the semiconductor device 30 described above with reference to FIGS. 2 and 3, the detailed explanations of the construction of the device and the parts or layers of the device will be omitted. Further, the same or similar part or layer in the device 30 will be described referring to the same reference numeral, unless otherwise specified.

The semiconductor device 56 comprises a circuit board 55 and a semiconductor chip 27 mounted on the by-pass capacitors 25 of the circuit board 55. The by-pass capacitor 25 is formed on the fourth insulating layer 49. The circuit board 55 has a wiring pattern 21. A lower surface of the wiring pattern 21 has a solder ball 26.

The by-pass capacitors 25 are positioned just below the semiconductor chip 27, and they are flip chip connected through a second electrode layer 22 and a pad 17. As is described below, the second electrode layer 22 and the pad 17 are produced from a solder layer applied to a circuit board-providing article at the initial stage of the production process. Each by-pass capacitor 25 is constituted from a first electrode layer 16 formed in the uppermost insulating layer 49 of the circuit board 55 a patterned ferroelectric layer 11 and a second electrode layer 22.

In addition to the by-pass capacitors 25, the circuit board 55 has a pad 17 also disposed in a mounting area of the semiconductor chip 27. The pad 17 is used for receiving and connecting a signal terminal of the semiconductor chip 27.

FIGS. 14A to 14L are cross-sectional views showing, in sequence, the preferred production process of the semiconductor device of FIG. 7.

Figure 14A:
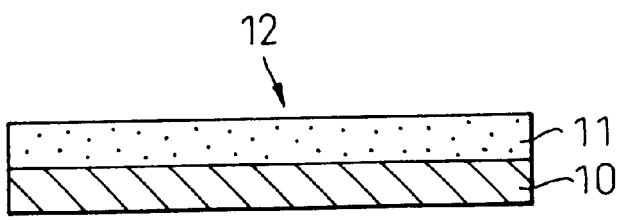
FIGS. 14A to 14L are cross-sectional views showing, in sequence, the production of the semiconductor device of FIG. 7.

First, as is shown in FIG. 14A, a circuit board-providing article 12 is prepared. The article 12 is a laminate of a copper foil 10 and a layer 11 of the ferroelectric material. The ferroelectric layer 11 is preferably made of ferroelectric materials such as STO, PZT, tantalum oxide and barium titanate.

Figure 14B:
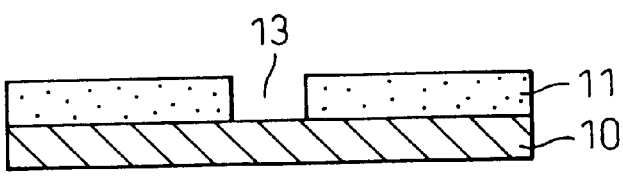

After the preparation of the circuit board-providing article 12, as is shown in FIG. 14B, a pad-providing opening 13 is formed in the ferroelectric layer 11 to expose the underlying copper foil 10. A laser fabrication method is preferably used in the formation of the opening 13.

Figure 14C:
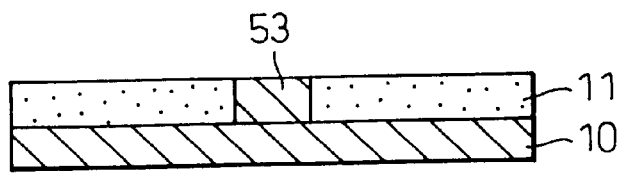

Next, the pad-providing opening 13 is filled with a copper 53, as is shown in FIG. 14C. Copper plating is preferably used.

Figure 14D:
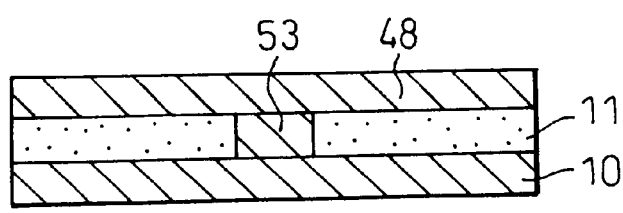

Thereafter, as is shown in FIG. 14D, a ferroelectric layer side of the circuit board-providing article 12 is plated with a solder to form a solder layer 48. The ferroelectric layer 11 is covered with the solder layer 48.

Figure 14E:
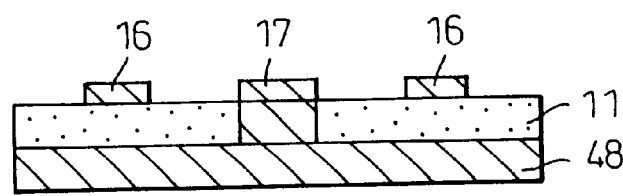

Then, the copper foil 10, as is shown in FIG. 14E, is selectively etched off to form a first electrode layer 16, along with a pad 17.

Figure 14F:
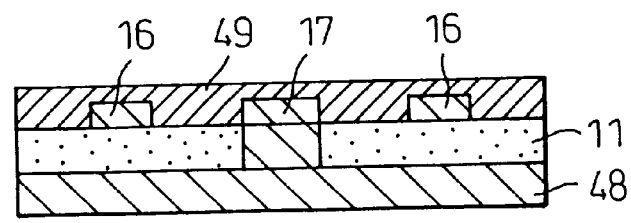

Next, as is shown in FIG. 14F, a fourth insulating layer 49 is applied over a surface of the ferroelectric layer 11 partially exposed as a result of the above etching. The fourth insulating layer 49 is preferably formed by coating a solution of a non-photosensitive resin such as polyimide or polyphenyleneether to, or adhering a sheet of such resin to, a surface of the ferroelectric layer 11.

Figure 14G:
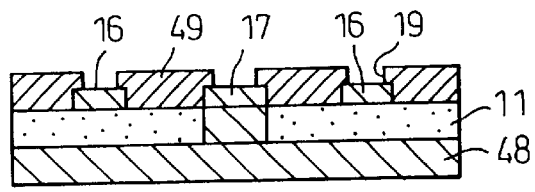

Next, as is shown in FIG. 14G, the fourth insulating layer 49 is selectively removed to form via holes 19. The formation of the via holes 19 is preferably carried out by using a laser fabrication method. As a result, the first electrode layer 16 and the pad 17 are exposed in the bottom section of the via holes 19. As mentioned above, a photolithographic process or other patterning processes may be used in place of the laser fabrication method, if desired. For example, in the photolithographic process, a photosensitive and insulating resist material is used in the formation of the fourth insulating layer 49, followed by formation of the via holes 19.

Figure 14H:
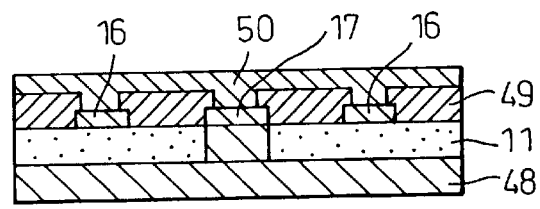

Thereafter, as is shown in FIG. 14H, a sixth copper plating layer 50 is formed over the fourth insulating layer 49. An electroless copper plating or an electrolytic copper plating is preferably used for this purpose. The resulting sixth copper plating layer 50 is electrically connecting with the first electrode layer 16 and the pad 17.

Figure 14I:
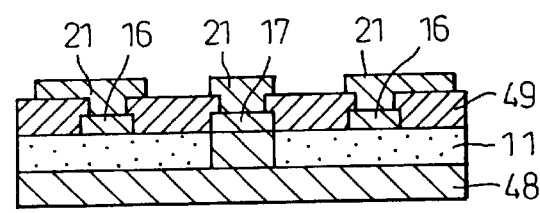

The sixth copper plating layer 50 is then selectively etched to form a wiring pattern 21, as is shown in FIG. 14I.

The wiring pattern 21 is electrically connecting with the first electrode layer 16 and the pad 17.

In the formation of the wiring pattern 21, if necessary, the above-described steps of the formation of the insulating layer, via holes, copper plating layer and wiring pattern may be repeated to form a multilayed circuit board (not shown).

Figure 14J:
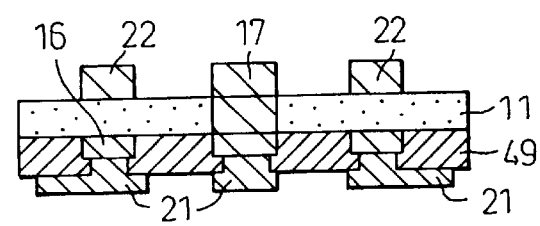

Following the formation of the wiring pattern 21, the formation of by-pass capacitors is started. As is shown in FIG. 14J, the solder layer 48 is selectively etched to form a second electrode layer 22 and a pad 17. The second electrode layer 22 and the pad 17 also can act as a soldering means for receiving and connecting a semiconductor chip in the resulting semiconductor device.

Figure 14K:
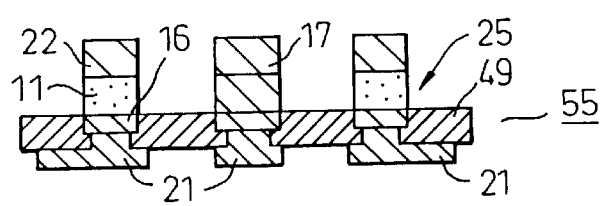

Next, as is shown in FIG. 14K, the ferroelectric layer 11 partially exposed as a result of the formation of the second electrode layer 22 and the pad 17 is etched off to form a patterned ferroelectric layer 11. Thus, as is illustrated, by-pass capacitors 25, each having a sandwich structure of the first electrode layer 16, the patterned ferroelectric layer 11 and the second electrode layer 22 are formed on the circuit board 55.

In the formation of the second electrode layer 22 and the patterned ferroelectric layer 11, it is preferred that different etchants are used in each of the etching processes so that the resulting pattern may be utilized as a masking means in the etching of the underlying layer. For example, in the etching of the ferroelectric layer 11, the previously formed second electrode layer 22 can be effectively used as a masking means.

Figure 14L:
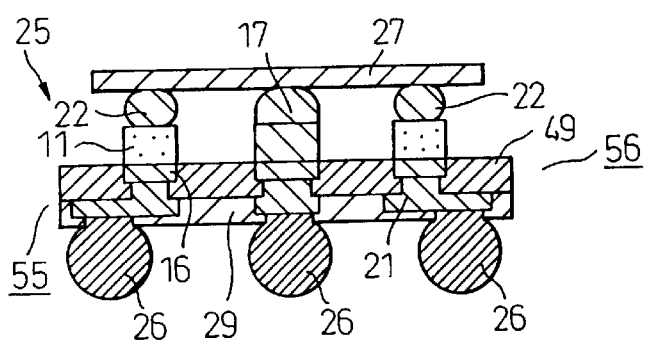

Finally, as is shown in FIG. 14L, corresponding to FIG. 7, a solder ball (external connection terminal) 26 is applied to the wiring pattern 21 of the circuit board 55, while a semiconductor chip 27 is flip chip connected to the second electrode layer 22 and the pad 17, both acting as a soldering means, of the by-pass capacitor 25. The semiconductor device 56 is thus obtained. In the semiconductor device 56, the wiring pattern 21 is covered with a solder resist 29. The solder ball 26 may be replaced with any other connecting means such as pin, if desired.

It will be appreciated in FIG. 14L that a plurality of by-pass capacitors 25 can be mounted in a packaging area of the semiconductor chip 27 of the circuit board 55, along with a pad 17 to be connected with a signal terminal of the semiconductor chip 27. Since the by-pass capacitors 25 can be positioned just below the semiconductor chip 27, the generation of the source noise can be prevented because of effective absorption of such a noise.

In the production processes of the circuit boards and semiconductor devices described above, the wiring pattern, electrode layers and pads were formed using an electroless copper plating or an electrolytic copper plating. However, they may be formed by forming a power supply layer from, for example, chromium layer or copper layer, with a sputtering method, followed by forming a copper layer with an electrolytic copper plating. Namely, the term "plating" used herein is intended to include a wide variety of film or coating formation technologies, typically a copper plating method and a combination of sputtering and copper plating. Of course, plating is not restricted to copper plating, and any other metals may be used in the plating purpose.

The present invention was described particularly with reference to the typical examples thereof. However, it should be noted that the present invention should not be restricted to these examples, and thus the present invention may be modified within the spirit and scope of the present invention.

What is claimed is:

1. A circuit board-providing article for use in the production of a circuit board having provided thereon at least one by-pass capacitor, said article comprising a laminated structure of a metallic foil and a layer of the ferroelectric material applied to one surface of the metallic foil, the ferroelectric material being strontium titanate ($SrTiO_3$), PZT (lead zirconate titanate), tantalum oxide ($Ta_2O_5$) or barium titanate ($BaTiO_2$).

2. The circuit board-providing article according to claim 1, which further comprises a layer of the soldering material.

3. A circuit board for use in the production of semiconductor devices, in which said circuit board comprises two or more pads formed thereon, and said pads each is a by-pass capacitor constituted from a laminated structure of a first electrode layer formed in an uppermost insulating layer of the circuit board, a ferroelectric layer formed, from a ferroelectric material having a higher dielectric constant than said insulating layer, over the first electrode layer, and a second electrode layer, formed over the ferroelectric layer, and designed to be electrically connected with a power source or grounding terminal of a semiconductor element.

4. The circuit board according to claim 3, in which said by-pass capacitors each is disposed in a mounting area of the semiconductor element, along with a pad to which a signal terminal of the semiconductor element is connected.

5. The circuit board according to claim 4, in which said by-pass capacitor is disposed substantially below the semiconductor element.

6. The circuit board according to claim 3, in which said circuit board further comprises a solder layer for connecting the semiconductor element on said second electrode layer or a pad thereof.

7. The circuit board according to claim 3, in which said ferroelectric material is strontium titanate ($SrTiO_3$), PZT (lead zirconate titanate), tantalum oxide ($Ta_2O_5$) or barium titanate ($BaTiO_2$).

8. A semiconductor device comprising a circuit board having mounted thereon a semiconductor element, in which said circuit board comprises two or more pads formed thereon, said each pad is a by-pass capacitor constituted from a laminated structure of a first electrode layer formed in an uppermost insulating layer of the circuit board, a ferroelectric layer formed, from a ferroelectric material having a higher dielectric constant than said insulating layer, over the first electrode layer, and a second electrode layer formed over the ferroelectric layer, and the second electrode layer of said by-pass capacitor as a pad is electrically connected with a power source or grounding terminal of said semiconductor element.

9. The semiconductor device according to claim 8, in which each said by-pass capacitor is disposed in a mounting area of, and is connected through flip chip connection with, said semiconductor element.

10. The semiconductor device according to claim 8, in which said by-pass capacitor is disposed substantially below said semiconductor element.

11. A circuit board-providing article for use in the production of a circuit board having provided thereon at least one by-pass capacitor, said article comprising a laminated structure of a metallic foil and a layer of the ferroelectric material applied by sputtering or chemical vapor deposition (CVD) on one surface of the metallic foil.

* * * * *